United States Patent
Kim et al.

(10) Patent No.: US 11,011,590 B2
(45) Date of Patent: May 18, 2021

(54) DISPLAY DEVICE HAVING A GROOVE IN A BLOCKING REGION AND AN AUXILIARY PATTERN OVERLAPPING THE GROOVE

(71) Applicant: SAMSUNG DISPLAY CO., LTD., Yongin-si (KR)

(72) Inventors: Ki Hoon Kim, Cheonan-si (KR); Deuk Jong Kim, Cheonan-si (KR); Jae Hak Lee, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/230,344

(22) Filed: Dec. 21, 2018

(65) Prior Publication Data
US 2019/0229164 A1    Jul. 25, 2019

(30) Foreign Application Priority Data
Jan. 25, 2018    (KR) ......................... 10-2018-0009305

(51) Int. Cl.
*H01L 27/32*    (2006.01)
*H01L 51/52*    (2006.01)
(Continued)

(52) U.S. Cl.
CPC ....... *H01L 27/3246* (2013.01); *G09G 3/3275* (2013.01); *H01L 27/1288* (2013.01);
(Continued)

(58) Field of Classification Search
CPC ............. H01L 27/3258; H01L 51/5256; H01L 51/5253–5256; H01L 51/5237; H01L 27/3272
See application file for complete search history.

(56) References Cited

U.S. PATENT DOCUMENTS

2015/0091030 A1*   4/2015   Lee ..................... H01L 27/3258
                                                       257/91
2015/0108452 A1*   4/2015   Park .................... H01L 51/5253
                                                       257/40
(Continued)

FOREIGN PATENT DOCUMENTS

KR         10-0786294         12/2007
KR         10-0804539         2/2008
(Continued)

OTHER PUBLICATIONS

Machine translation of IDS reference KR20130137455 (Dec. 17, 2013).*

(Continued)

*Primary Examiner* — Younes Boulghassoul
(74) *Attorney, Agent, or Firm* — F. Chau & Associates, LLC

(57) ABSTRACT

A display device includes a substrate including a display area and a non-display area adjacent to the display area. The non-display area includes a blocking region. An organic layer is disposed on the substrate. An emission layer is disposed in the display area of the substrate. An auxiliary pattern is disposed in the blocking region of the non-display area of the substrate. A thin film encapsulation layer is disposed on the substrate and overlaps the emission layer and the blocking region. The organic layer has a groove penetrating an entire thickness of the organic layer in the blocking region. The auxiliary pattern overlaps the groove. The auxiliary pattern includes a same material as a gate electrode disposed in the display area of the substrate.

11 Claims, 20 Drawing Sheets

(51) Int. Cl.
   *G09G 3/3275*   (2016.01)
   *H01L 27/12*   (2006.01)
   *H01L 51/56*   (2006.01)
   *H01L 51/00*   (2006.01)

(52) U.S. Cl.
   CPC ...... *H01L 27/3248* (2013.01); *H01L 27/3258* (2013.01); *H01L 27/3265* (2013.01); *H01L 27/3276* (2013.01); *H01L 51/525* (2013.01); *H01L 51/5206* (2013.01); *H01L 51/5221* (2013.01); *H01L 51/5253* (2013.01); *H01L 51/5256* (2013.01); *H01L 51/0097* (2013.01); *H01L 51/5237* (2013.01); *H01L 51/56* (2013.01)

(56) References Cited

U.S. PATENT DOCUMENTS

2016/0365398 A1* 12/2016 Kim .................. H01L 27/3258
2017/0243525 A1* 8/2017 Morikawa ................ G09F 9/30
2017/0331058 A1* 11/2017 Seo ...................... G02B 5/3016
2017/0373128 A1* 12/2017 Lee .................... H01L 27/3258
2018/0006098 A1* 1/2018 Hong ................. H01L 51/5228
2018/0090700 A1* 3/2018 Nishinohara ....... H01L 27/3262
2018/0123082 A1* 5/2018 Sasaki ................ H01L 51/5237
2018/0151838 A1* 5/2018 Park ...................... G06F 3/0412
2018/0226617 A1* 8/2018 Nakagawa ............. H01L 51/56
2019/0006442 A1* 1/2019 Byun ................ H01L 27/3246

FOREIGN PATENT DOCUMENTS

KR   10-2013-0137455    12/2013
KR   10-2017-0080311    7/2017

OTHER PUBLICATIONS

Machine translation of IDS reference KR20070117363 (Dec. 10, 2007).*

* cited by examiner

DISPLAY DEVICE HAVING A GROOVE IN A BLOCKING REGION AND AN AUXILIARY PATTERN OVERLAPPING THE GROOVE

CROSS-REFERENCE TO RELATED APPLICATION

This application claims priority to Korean Patent Application No. 10-2018-0009305 filed in the Korean Intellectual Property Office on Jan. 25, 2018, the disclosure of which is incorporated by reference herein in its entirety.

TECHNICAL FIELD

Exemplary embodiments of the present invention relate to a display device, and more particularly to a display device having a groove in a blocking region.

DISCUSSION OF RELATED ART

A display device may be penetrated by moisture or oxygen, and when moisture or oxygen inflows from the outside, an emission layer may be damaged or signal lines may be oxidized. The display area may be encapsulated, which may reduce a penetration of moisture or oxygen and may prolong a life span of the display device.

When the display area is encapsulated by an encapsulation layer, moisture or oxygen may inflow into the display device through an organic layer included in the display device.

SUMMARY OF THE INVENTION

An exemplary embodiment of the present invention provides a display device blocking moisture or oxygen from flowing inside the display area enclosed by the encapsulation layer.

A display device according to an exemplary embodiment of the present invention includes a substrate including a display area and a non-display area adjacent to the display area. The non-display area includes a blocking region. An organic layer is disposed on the substrate. An emission layer is disposed in the display area of the substrate. An auxiliary pattern is disposed in the blocking region of the non-display area of the substrate. A thin film encapsulation layer is disposed on the substrate and overlaps the emission layer and the blocking region. The organic layer has a groove penetrating an entire thickness of the organic layer in the blocking region. The auxiliary pattern overlaps the groove. The auxiliary pattern includes a same material as a gate electrode disposed in the display area of the substrate.

The encapsulation layer may include a first inorganic encapsulation layer and a second inorganic encapsulation layer. An organic encapsulation layer may be disposed between the first inorganic encapsulation layer and the second inorganic encapsulation layer. The organic encapsulation layer may substantially cover the display area and a part of the non-display area. The blocking region may overlap the organic encapsulation layer.

The display device may include a semiconductor layer disposed on the substrate. A first gate insulating layer may be disposed on the semiconductor layer. T gate electrode may be disposed on the first gate insulating layer. A second gate insulating layer may be disposed on the gate electrode. A storage electrode may be disposed on the second gate insulating layer. A first insulating layer may be disposed on the storage electrode. An input electrode and an output electrode may be disposed on the first insulating layer and may be connected to the semiconductor layer. A second insulating layer may be disposed on the input electrode and the output electrode. A data line and a driving voltage line may be disposed on the second insulating layer. The organic layer may include a first interlayer insulating layer disposed on the second insulating layer and a second interlayer insulating layer disposed on the first interlayer insulating layer.

The auxiliary pattern may include a same material as the gate electrode.

The auxiliary pattern may include a first layer and a second layer overlapping each other with the second gate insulating layer disposed between the first layer and the second layer. The first layer may include a same material as the gate electrode. The second layer may include a same material as the storage electrode.

The auxiliary pattern may be disposed on the first insulating layer. The auxiliary pattern may include a same material as the input electrode and the output electrode.

The auxiliary pattern may include a first layer and a second layer overlapping each other with the second insulating layer disposed between the first layer and the second layer. The first layer may include a same material as the input electrode and the output electrode. The second layer may include a same material as the data line and the driving voltage line.

The auxiliary pattern may include a same material as the data line and the driving voltage line.

The display device may include a common voltage transmitting line disposed in the non-display area. The blocking region may be disposed between the display area and the common voltage application line.

The display device may include a first spacer and a second spacer disposed in the non-display area. The first spacer may overlap the common voltage application line. The second spacer may be separated farther from the display area than the first spacer.

A display device according to an exemplary embodiment of the present invention includes a substrate including a display area and a non-display area adjacent to the display area. The non-display area includes a blocking region. An organic layer is disposed on the substrate. An emission layer is disposed in the display area of the substrate. A thin film encapsulation layer is disposed on the substrate and overlaps the emission layer and the blocking region. A first thickness of the organic layer disposed on the display area is larger than a second thickness of the organic layer disposed in the blocking region. The organic layer has a groove penetrating an entire thickness of the organic layer in the blocking region.

The display device may include an auxiliary pattern disposed in the blocking region of the non-display area. The auxiliary pattern may overlap the groove. The auxiliary pattern may include a same material as an electrode layer disposed in the display area of the substrate.

A display device according to an exemplary embodiment of the present invention includes a substrate including a display area and a non-display area adjacent to the display area.

The non-display area includes a blocking region. An insulating layer is disposed on the substrate. An organic layer is disposed on the insulating layer in the display area and the non-display area. A common electrode is disposed on the organic layer. An inorganic encapsulation layer is disposed on the common electrode. The common electrode and the inorganic encapsulation layer define a groove in the organic layer in the blocking region. A portion of the common electrode defining a bottom surface of the groove is in direct contact with the insulating layer disposed on the substrate.

An auxiliary pattern may be disposed between the substrate and the insulating layer. The auxiliary pattern may overlap the groove along a direction orthogonal to an upper surface of the substrate.

The organic layer may include a first interlayer insulating layer and a second interlayer insulating layer disposed on the first interlayer insulating layer.

An organic encapsulation layer may be disposed on the inorganic encapsulation layer in the display area and the non-display area. The organic encapsulation layer may fill the groove.

According to an exemplary embodiment of the present invention, the display device may prevent moisture or oxygen from flowing into the display area enclosed by the encapsulation layer.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF THE EMBODIMENTS

Figure 1:
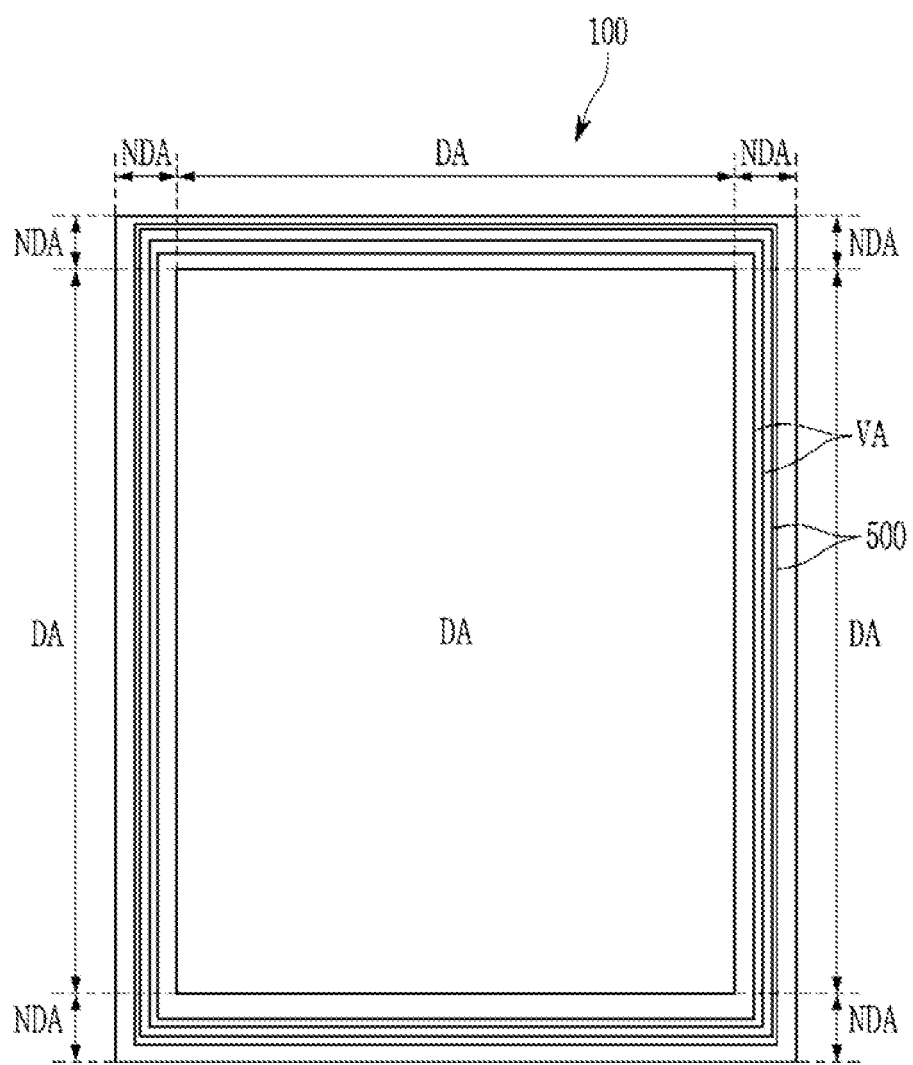
FIG. 1 is a layout view of a display device according to an exemplary embodiment of the present invention.

Exemplary embodiments of the present invention will be described below in more detail with reference to the accompanying drawings. In this regard, the exemplary embodiments may have different forms and should not be construed as being limited to the exemplary embodiments of the present invention described herein Like reference numerals may refer to like elements throughout the specification and drawing Sizes of elements in the drawings may be exaggerated for clarity of description It will be understood that when a component, such as a layer, a film, a region, or a plate, is referred to as being "on" another component, the component may be directly on the other component or intervening components may be present Throughout the specification, the phrase "on a plane" or "in a plan view" may refer to viewing the object portion from the top, and the phrase "on a cross-section" or "a cross-sectional view) may refer to viewing a cross-section of which the object portion is vertically cut from the side.

Figure 2:
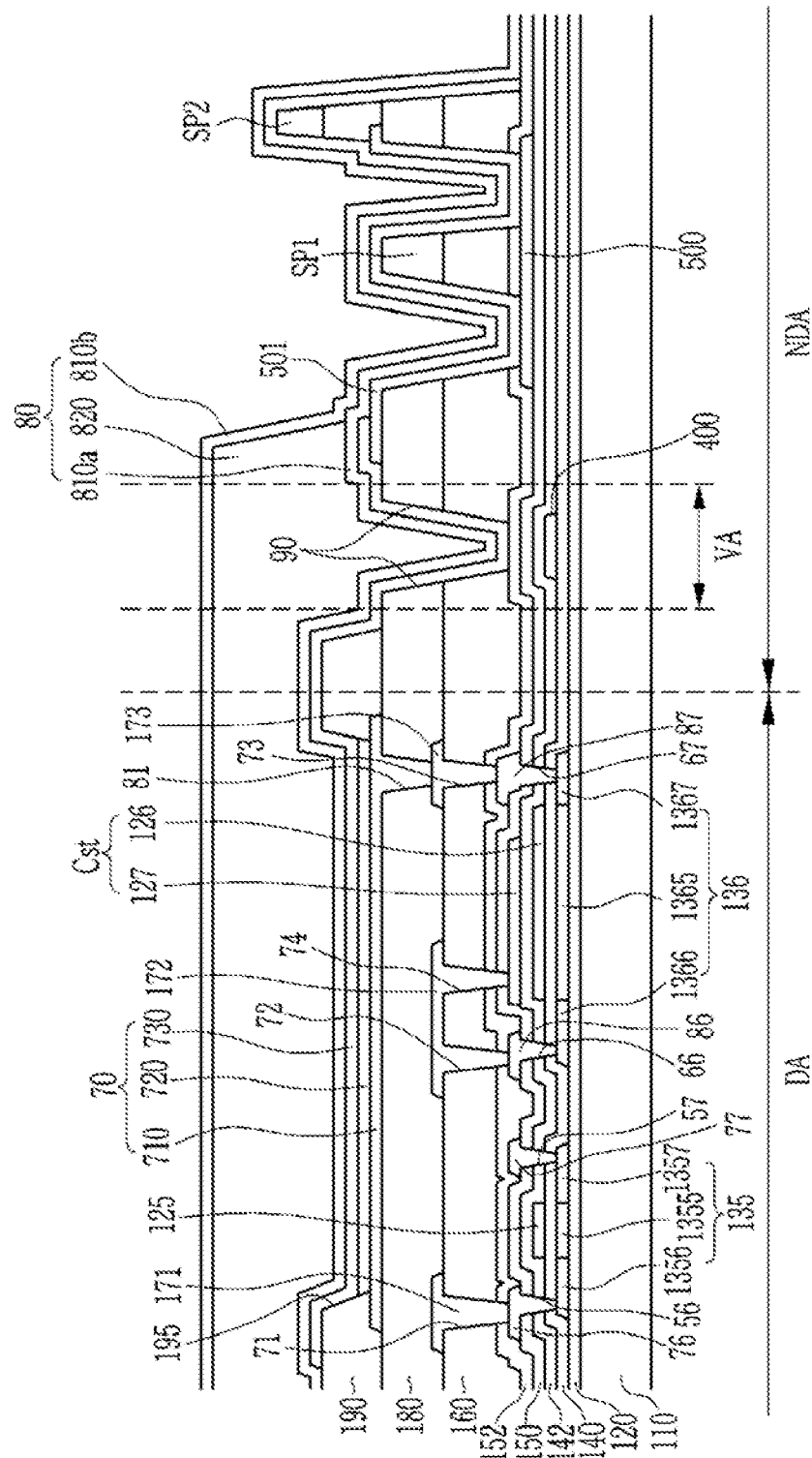
FIG. 2 is a cross-sectional view of a display device according to an exemplary embodiment of the present invention.
Figure 3:
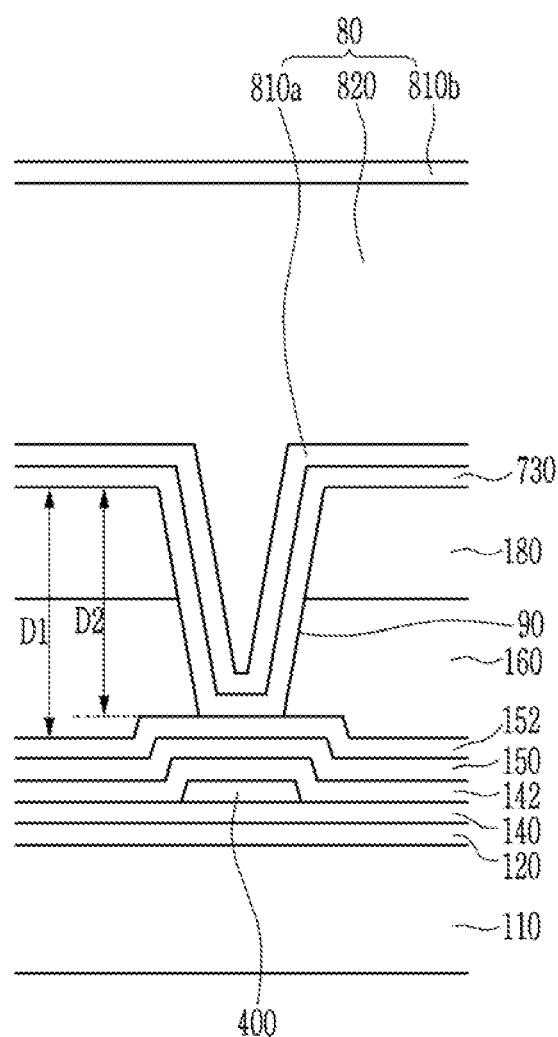
FIG. 3 is a cross-sectional view of a part of FIG. 2.

A display device according to an exemplary embodiment of the present invention will be described in more detail below with reference to FIG. 1 to FIG. 3. FIG. 1 is a layout view of a display device according to an exemplary embodiment of the present invention. FIG. 2 is a cross-sectional view of a part of a display device according to an exemplary embodiment of the present invention. FIG. 3 is a cross-sectional view of a part of FIG. 2.

Referring to FIG. 1, a display device 100 according to an exemplary embodiment of the present invention may include a display area DA, which may be configured to display an image and a non-display area NDA disposed outside the display area DA. For example, the non-display area NDA may be adjacent to the display area DA. The non-display area NDA may be arranged at four sides of the display area DA in a plan view. Alternatively, the non-display area NDA may be arranged at less than four sides (e.g., at three sides) of the display area DA in a plan view. A blocking region VA may be disposed in the non-display area NDA. The blocking region VA may be configured to block an inflow of moisture or oxygen (e.g., in to the display area DA). A common voltage transmitting line 500 may transmit a common voltage in an area of the non-display area NDS. The blocking region VA may enclose the display area DA, and may be disposed between the display area DA and the common voltage transmitting line 500. In an exemplary embodiment of the present invention, the common voltage transmitting line 500 also encloses the display area DA, however, exemplary embodiments of the present invention are not limited thereto, and the common voltage transmitting line 500 may be adjacent to a part of the display area DA.

A driver transmitting a signal to the display area DA may be disposed in the non-display area NDA.

Referring to FIG. 2, the display device 100 according to an exemplary embodiment of the present invention may include a substrate 110. The substrate 110 may be flexible and may include at least one flexible material. The substrate 110 may include a plurality of insulating films overlapping each other (e.g., stacked on each other), and may further include a barrier film disposed between the overlapping insulating films.

A buffer layer 120 may be disposed on the substrate 110. The buffer layer 120 may have a single layer structure including an insulating layer. The insulating layer may include a silicon nitride (SiNx) or a silicon oxide (SiOx). Alternatively, the insulating layer may have a multilayer structure including a silicon nitride (SiNx) or a silicon oxide (SiOx). The buffer layer 120 may prevent penetration of impurities or moisture. For example, the buffer layer 120 may prevent a penetration of moisture or oxygen, such as a penetration of moisture or oxygen to an emission layer or a signal line of a display device.

A first semiconductor layer 135 and a second semiconductor layer 136 may be disposed on the buffer layer 120 in the display area DA.

The first semiconductor layer 135 and the second semiconductor layer 136 may each include a polysilicon or an oxide semiconductor. As an example, the oxide semiconductor may include one of oxides based on titanium (Ti), hafnium (Hf), zirconium (Zr), aluminum (Al), tantalum (Ta), germanium (Ge), zinc (Zn), gallium (Ga), tin (Sn), or indium (In), or complex oxides thereof.

The first semiconductor layer 135 may includes a first channel region 1355, and a first source region 1356 and a first drain region 1357 disposed at opposite sides of the first channel region 1355. The second semiconductor layer 136 may include a second channel region 1365, and a second source region 1366 and a second drain region 1367 disposed at opposite sides of the second channel region 1365. The first channel region 1355 of the first semiconductor layer 135 and the second channel region 1365 of the second semiconductor layer 136 may be regions in which an impurity is not doped, and the first source region 1356 and the first drain region 1357 of the first semiconductor layer 135 and the second source region 1366 and the second drain region 1367 of the second semiconductor layer 136 may be regions in which a conductive impurity is doped.

A first gate insulating layer 140 may be disposed on the first semiconductor layer 135 and the second semiconductor layer 136.

A first gate electrode 125 and a second gate electrode 126 may be disposed on the first gate insulating layer 140 of the display area DA, and a first auxiliary pattern 400 may be disposed on the first gate insulating layer 140 of the blocking region VA of the non-display area NDA. The first gate electrode 125 and the second gate electrode 126 may be referred to herein as a first gate wire.

The first gate electrode 125 may overlap the first channel region 1355 (e.g., along a direction orthogonal to an upper surface of the substrate 110), and the second gate electrode 126 may overlap the second channel region 1365 (e.g., along the direction orthogonal to the upper surface of the substrate 110). The first auxiliary pattern 400 may include a same material as the first gate electrode 125 and the second gate electrode 126. This may result from the first auxiliary pattern 400 and the first gate electrode 125 and the second gate electrode 126 being substantially simultaneously formed (e.g., by using a same material).

A second gate insulating layer 142 may be disposed on the first gate electrode 125 and the second gate electrode 126, and the first auxiliary pattern 400.

The first gate insulating layer 140 and the second gate insulating layer 142 may each include a single layer including a silicon oxide (SiOx), or a silicon nitride (SiNx), or alternatively, each of the first gate insulating layer 140 and the second gate insulating layer 142 may have a multilayer structure including a silicon oxide (SiOx), or a silicon nitride (SiNx).

A storage electrode 127 may be disposed on the second gate insulating layer 142. The storage electrode 127 may be referred to herein as a second gate wire.

A first insulating layer 150 may be disposed on the storage electrode 127. The first insulating layer 150 may have a single layer structure including a silicon oxide (SiOx), or a silicon nitride (SiNx), or alternatively, the first insulating layer 150 may have a multilayer structure including a silicon oxide (SiOx), or a silicon nitride (SiNx).

The first gate insulating layer 140, the second gate insulating layer 142, and the first insulating layer 150 have a first contact hole 56 overlapping the first source region 1356 of the first semiconductor layer 135 (e.g., along the direction orthogonal to the upper surface of the substrate 110), a second contact hole 57 overlapping the first drain region 1357 of the first semiconductor layer 135 (e.g., along the direction orthogonal to the upper surface of the substrate 110), a third contact hole 66 overlapping the second source region 1366 of the second semiconductor layer 136 (e.g., along the direction orthogonal to the upper surface of the substrate 110), and a fourth contact hole 67 overlapping the second drain region 1367 of the second semiconductor layer 136 (e.g., along the direction orthogonal to the upper surface of the substrate 110).

A first input electrode 76, a first output electrode 77, a second input electrode 86, and a second output electrode 87 may be formed on the first insulating layer 150 of the display area DA, and the common voltage transmitting line 500 may be formed on the first insulating layer 150 of the non-display area NDA. The first input electrode 76, the first output electrode 77, the second input electrode 86, and the second output electrode 87 may be referred to as a first data wire.

The common voltage transmitting line 500 may include a same material as the first input electrode 76, the first output electrode 77, the second input electrode 86, and the second output electrode 87. This may result from the common voltage transmitting line 500, the first input electrode 76, the first output electrode 77, the second input electrode 86, and the second output electrode 87 being substantially simultaneously formed (e.g., by using a same material).

The first input electrode 76 may be connected to the first source region 1356 of the first semiconductor layer 135 through the first contact hole 56. The first output electrode 77 may be connected to the first drain region 1357 of the first semiconductor layer 135 through the second contact hole 57. The second input electrode 86 may be connected to the second source region 1366 of the second semiconductor layer 136 through the third contact hole 66. The second output electrode 87 may be connected to the second drain region 1367 of the second semiconductor layer 136 through the fourth contact hole 67. The first output electrode 77 is connected to the second gate electrode 126. For example, the first output electrode 77 may be directly and/or electrically connected to the second gate electrode 126.

A second insulating layer 152 may be disposed on the first input electrode 76, the first output electrode 77, the second input electrode 86, and the second output electrode 87. The second insulating layer 152 may have a single layer structure including a silicon oxide (SiOx), or a silicon nitride (SiNx), or may have a multilayer structure including a silicon oxide (SiOx), or a silicon nitride (SiNx).

A first interlayer insulating layer 160 may be disposed on the second insulating layer 152. The first interlayer insulating layer 160 may include an organic material. The second insulating layer 152 and the first interlayer insulating layer 160 may have a fifth contact hole 71 overlapping the first input electrode 76 (e.g., along the direction orthogonal to the upper surface of the substrate 110), a sixth contact hole 72 overlapping the second input electrode 86 (e.g., along the direction orthogonal to the upper surface of the substrate 110), and a seventh contact hole 73 overlapping the second output electrode 87 (e.g., along the direction orthogonal to the upper surface of the substrate 110). The first insulating layer 150, the second insulating layer 152, and the first interlayer insulating layer 160 may have an eighth contact hole 74 overlapping the storage electrode 127 (e.g., along the direction orthogonal to the upper surface of the substrate 110).

A data line 171, a driving voltage line 172, and an output member 173 may be disposed on the first interlayer insulating layer 160. The data line 171, the driving voltage line 172, and the output member 173 may each be referred to as a second data wire.

The data line 171 may be connected to the first input electrode 76 through the fifth contact hole 71. The driving voltage line 172 may be connected to the second input electrode 86 through the sixth contact hole 72 and may be connected to the storage electrode 127 through the eighth contact hole 74. The output member 173 may be connected to the second output electrode 87 through the seventh contact hole 73.

A second interlayer insulating layer 180 may be disposed on the data line 171, the driving voltage line 172, and the output member 173. The second interlayer insulating layer 180 may include an organic material.

The second interlayer insulating layer 180 may have a ninth contact hole 81 overlapping the output member 173 (e.g., along the direction orthogonal to the upper surface of the substrate 110).

A groove 90 may be formed in the first interlayer insulating layer 160 and the second interlayer insulating layer 180. Each of the first interlayer insulating layer 160 and the second interlayer insulating layer 180 may include an organic layer disposed on the blocking region VA of the non-display area NDA. The blocking region VA may overlap an encapsulation layer 80 (e.g., along the direction orthogonal to the upper surface of the substrate 110). The encapsulation layer 80 is described in more detail below. The groove 90 may overlap the first auxiliary pattern 400 disposed in the blocking region VA.

According to an exemplary embodiment of the present invention, the first interlayer insulating layer 160 and the second interlayer insulating layer 180 may each include an organic material and may collectively be referred to as an organic layer herein. For example, the first interlayer insulating layer 160 may include a different organic material than an organic material included in the second interlayer insulating layer 180. Alternatively, the first interlayer insulating layer 160 and the second interlayer insulating layer 180 may include a same organic material as each other.

The groove 90 formed in the blocking region VA may enclose the display area DA, and may prevent external moisture and air that may inflow through the first interlayer insulating layer 160 and the second interlayer insulating layer 180 disposed in the non-display area NDA into the display area DA. For example, the groove 90 may prevent a penetration of moisture or oxygen, such as a penetration of moisture or oxygen to an emission layer or a signal line of a display device.

A pixel electrode 710 may be disposed on the second interlayer insulating layer 180 disposed in the display area DA. The pixel electrode 710 may be connected to the output member 173 through the ninth contact hole 81 formed in the second interlayer insulating layer 180.

The pixel electrode 710 may be an anode of the organic light emitting element.

A first electrode member 501 that is in contact (e.g., direct contact) with the common voltage transmitting line 500 may be disposed on the second interlayer insulating layer 180 disposed in the non-display area NDA. The first electrode member 501 may include a same material as the pixel electrode 710. This may result from the first electrode member 501 and the pixel electrode 710 being substantially simultaneously formed (e.g., by using a same material) A pixel definition layer 190 may be disposed on the pixel electrode 710. The pixel definition layer 190 may have an opening 195 overlapping the pixel electrode 710 (e.g., along the direction orthogonal to the upper surface of the substrate 110). The opening 195 of the pixel definition layer 190 may be disposed on the display area DA, and the pixel definition layer 190 may be mainly disposed on the display area. However, the pixel definition layer 190 may overlap at least a portion of the non-display area NDA (e.g., may overlap a portion of the blocking region VA). The pixel definition layer 190 may include a polyacrylate-based resin or a polyimide-based resin, and a silica-based inorganic material.

An organic emission layer 720 may be disposed in the opening 195 of the pixel definition layer 190.

The organic emission layer 720 may include multiple layers such as an emission layer and one or more among a hole-injection layer (HIL), a hole-transporting layer (HTL), an electron-transporting layer (ETL), or an electron-injection layer (EIL). In the case where the organic emission layer 720 includes all the layers described above, the hole-injection layer may be disposed on the pixel electrode 710 which is an anode, and the hole-transporting layer, the emission layer, the electron-transporting layer, and the electron-injection layer may be sequentially stacked thereon.

A common electrode 730 may be disposed on the pixel definition layer 190 and the organic emission layer 720. The common electrode 730 may be a cathode of the organic light emitting element. Accordingly, the pixel electrode 710, the organic emission layer 720, and the common electrode 730 may be included in an organic light emitting element 70.

The organic light emitting diode display may have, for example, a top display type, a rear display type, and a both sides display type according to a direction in which the organic light emitting element 70 emits light.

In the case of the top display type, the pixel electrode 710 may be a reflective layer, and the common electrode 730 may be a semi-transparent layer or a transparent layer. In the case of the bottom display type, the pixel electrode 710 may be a semi-transparent layer, and the common electrode 730 may be a reflective layer. In the case of the both-sides display type, the pixel electrode 710 and the common electrode 730 may be the transparent layer or the semi-transparent layer. The reflective layer and the semi-transparent layer may each include one or more metals of magnesium (Mg), silver (Ag), gold (Au), calcium (Ca), lithium (Li), chromium (Cr), or aluminum (Al), or an alloy thereof. The light reflectance of the reflective layer and the light transmittance of the semi-transparent layer may be determined by a thickness thereof. As an example, the semi-transparent layer may have a thickness of 200 nm or less. Transmittance of light may be increased as the thickness is reduced, but if the thickness is relatively small, resistance may be increased. The transparent layer may include a material such as ITO (indium tin oxide), IZO (indium zinc oxide), ZnO (zinc oxide), or indium oxide.

The common electrode 730 may be formed on substantially the entire display area DA, and may extend to the non-display area NDA. The common electrode 730 may be in direct contact with the first electrode member 501.

The common electrode 730 may receive the common voltage transmitted to the common voltage transmitting line 500 through the first electrode member 501 that is in direct contact with the common voltage transmitting line 500.

If a gate-on signal is applied to the first gate electrode 125 and a data signal is applied from the data line 171 to the first input electrode 76, the data signal may be transmitted to the first output electrode 77 and then may be applied to the second gate electrode 126. The driving voltage applied to the driving voltage line 172 may be applied to the second input electrode 86, and then may be applied to the second output electrode 87 through the second channel region 1365 of the second semiconductor layer 136. The voltage applied to the second output electrode 87 may be transmitted to the pixel electrode 710 through the output member 173, and the common voltage may be applied to the common electrode 730 through the common voltage transmitting line 500. The pixel electrode 710 may be the anode of the hole injection electrode, and the common electrode 730 may be the cathode of the electron injection electrode. Holes and electrons from the pixel electrode 710 and the common electrode 730 may be injected into the organic emission layer 720, respectively. Light emission may be achieved when an exciton including injected holes and electrons is changed from an excited state to a ground state.

A capacitor Cst may be connected between the second gate electrode 126 and the storage electrode 127. The capacitor Cst may provide an electrical charge and maintain a data signal applied to the second gate electrode 126.

The first spacer SP1 and the second spacer SP2 may be disposed in the outer part of the non-display area NDA. The first spacer SP1 may overlap the common voltage transmitting line 500 (e.g., along the direction orthogonal to the upper surface of the substrate 110), and the second spacer SP2 may be disposed farther away from the display area DA than the first spacer SP1. For example, the second spacer SP2 may be disposed at the outer side of the first spacer SP1. For example, the first spacer SP1 may be relatively closer to the groove 90 than the second spacer SP2, and each of the first spacer SP1 and the second spacer SP2 may be positioned in the non-display area NDA in an area spaced apart from the blocking region VA of the non-display area NDA.

The first spacer SP1 may include a same material as the first interlayer insulating layer 160 and the second interlayer insulating layer 180 that are disposed in the display area DA. This may result from first spacer SP1, the first interlayer insulating layer 160 and the second interlayer insulating layer 180 being substantially simultaneously formed (e.g., by using a same material). The second spacer SP2 may include a same material as the first interlayer insulating layer 160, the second interlayer insulating layer 180, and the pixel definition layer 190 that are disposed in the display area DA and an additional insulating layer. This may result from the second spacer SP2, the first interlayer insulating layer 160, the second interlayer insulating layer 180, the pixel definition layer 190 and the additional insulating layer being substantially simultaneously formed (e.g., by using a same material).

The encapsulation layer 80 may be disposed on the common electrode 730. The encapsulation layer 80 may be formed by alternately stacking at least one inorganic layer and at least one organic layer, and a plurality of inorganic layers or a plurality of organic layers may be alternately and repeatedly stacked.

In an exemplary embodiment of the present invention, the encapsulation layer 80 may include a first inorganic encapsulation layer 810a and a second inorganic encapsulation layer 810b. As an example, the encapsulation layer 80 may include an organic encapsulation layer 820 disposed between the first inorganic encapsulation layer 810a and the second inorganic encapsulation layer 810b. For example, the second inorganic encapsulation layer 810b may be formed on upper and side surfaces of the organic encapsulation layer 820. The first inorganic encapsulation layer 810a may be conformally formed on side and bottom surfaces of the groove 90. The first inorganic encapsulation layer 810a may be in direct contact with the common electrode 730 formed on the side and bottom surfaces of the groove 90.

The first inorganic encapsulation layer 810a and the second inorganic encapsulation layer 810b may be formed on substantially the entire surface of the substrate 110. The first inorganic encapsulation layer 810a and the second inorganic encapsulation layer 810b may be disposed on the first spacer SP1 and the second spacer SP2, however the organic encapsulation layer 820 might not be disposed outward of the first spacer SP1 and the second spacer SP2 among the non-display area NDA. For example, the organic encapsulation layer 820 may be spaced apart from the first spacer SP1 and the second spacer SP2 along a direction parallel to the upper surface of the substrate 110. Thus, the organic encapsulation layer 820 might not overlap the first spacer SP1 or the second spacer SP2 (e.g., along the direction orthogonal to the upper surface of the substrate 110).

When forming the organic encapsulation layer 820, the first spacer SP1 and the second spacer SP2 may function as a dam so that an organic material included in the organic encapsulation layer 820 does not overflow, and since the organic material does not to overflow outside of the first spacer SP1 and the second spacer SP2, the organic encapsulation layer 820 may be formed to not be disposed at the outer part of the first spacer SP1 and the second spacer SP2.

The groove 90 may be formed in the first interlayer insulating layer 160 and the second interlayer insulating layer 180 that are disposed at the blocking region VA of the non-display area NDA. For example, the groove 90 may fully penetrate each of the first interlayer insulating layer 160 and the second interlayer insulating layer 180 (e.g., along the direction orthogonal to the upper surface of the substrate 110). The groove 90 formed in the blocking region VA may overlaps the first inorganic encapsulation layer 810a and the second inorganic encapsulation layer 810b of the thin film encapsulation layer 80, and the organic encapsulation layer 820 (e.g., along the direction orthogonal to the upper surface of the substrate 110).

When the groove 90 is formed in the first interlayer insulating layer 160 and the second interlayer insulating layer 180 disposed in the blocking region VA overlapping the thin film encapsulation layer 80, external moisture and air may be prevented from flowing into the display area DA covered by the thin film encapsulation layer 80 through the first interlayer insulating layer 160 and the second interlayer insulating layer 180 disposed in the non-display area NDA. For example, the groove 90 may prevent a penetration of moisture or oxygen, such as a penetration of moisture or oxygen to an emission layer or a signal line of a display device.

When the groove 90 overlaps the first auxiliary pattern 400 disposed at the blocking region VA (e.g., along the direction orthogonal to the upper surface of the substrate 110), the depth of the groove 90 may be greater than a sum of the thicknesses of the first interlayer insulating layer 160 and the second interlayer insulating layer 180. In this way, as the height of the groove 90 formed in the first interlayer insulating layer 160 and the second interlayer insulating layer 180 disposed at the blocking region VA is lowered, when forming the groove 90, the organic material may be prevented from remaining, and the external moisture and air may be prevented from flowing through an organic material positioned in the groove 90.

The structure of the pixel disposed at the display area DA of the display device is described with reference to FIG. 2 as an example, and the pixel structure of the display device according to an exemplary embodiment of the present invention is not limited to the structure described with reference to FIG. 2. The signal line and the organic light emitting element may be formed with various configurations within a range that can be modified or realized by a person skilled in the art. For example, referring to FIG. 2, as the display device, the display device including two thin film transistors (TFT) and one capacitor is described as an example, however exemplary embodiments of the present invention are not limited thereto. For example, a display device according to an exemplary embodiment of the present invention is not limited to a particular number of thin film transistors, capacitors, or wires.

The blocking region VA is described in more detail below with reference to FIG. 3.

Referring to FIG. 3, the groove 90 formed in the first interlayer insulating layer 160 and the second interlayer insulating layer 180 disposed in the blocking region VA may overlap the first inorganic encapsulation layer 810a and the second inorganic encapsulation layer 810b of the thin film encapsulation layer 80, and the organic encapsulation layer 820 (e.g., along the direction orthogonal to the upper surface of the substrate 110). The groove 90 may overlap the first auxiliary pattern 400 disposed at the blocking region VA (e.g., along the direction orthogonal to the upper surface of the substrate 110). The first auxiliary pattern 400 may include a same material as the first gate electrode 125 and the second gate electrode 126 disposed in the display area DA. This may result from the first auxiliary pattern 400, the first gate electrode 125 and the second gate electrode 126 being substantially simultaneously formed (e.g., by using a same material)

As an example, when the groove 90 is formed in the first interlayer insulating layer 160 and the second interlayer insulating layer 180 disposed in the blocking region VA overlapping the thin film encapsulation layer 80, external moisture and air may be prevented from flowing into the display area DA covered by the thin film encapsulation layer 80 through the first interlayer insulating layer 160 and the second interlayer insulating layer 180 disposed in the non-display area NDA.

When the groove 90 overlaps the first auxiliary pattern 400 disposed at the blocking region VA, a first thickness D1 of the first interlayer insulating layer 160 and the second interlayer insulating layer 180 may be larger than a second thickness D2 in which the groove 90 is formed by the step of the first auxiliary pattern 400. For example, as the height of the groove 90 formed in the first interlayer insulating layer 160 and the second interlayer insulating layer 180 disposed in the blocking region VA is lower than the thickness of the first interlayer insulating layer 160 and the second interlayer insulating layer 180, when forming the groove 90, the organic material may be prevented from remaining, and the external moisture and air may be prevented from flowing through the organic material remaining in the groove 90.

A display device according to an exemplary embodiment of the present invention may include the substrate 110 including the display area DA and the non-display area NDA adjacent to the display area. The non-display area NDA may include the blocking region VA. An insulating layer (e.g., at least one of insulating layers 140, 142, 150 or 152) may be disposed on the substrate 110. The organic layer (e.g., at least one of first interlayer insulating layer 160 or second interlayer insulting layer 180) may be disposed on the insulating layer in the display area DA and the non-display area NDA. The common electrode 730 may be disposed on the organic layer. The inorganic encapsulation layer (e.g., first inorganic encapsulation layer 810a) may be disposed on the common electrode 730. The common electrode 730 and the inorganic encapsulation layer 810a may define the groove 90 in the organic layer in the blocking region VA. A portion of the common electrode 730 defining a bottom surface of the groove 90 may be in direct contact with the insulating layer (e.g., with insulting layer 152) disposed on the substrate 110. The auxiliary pattern (e.g., auxiliary pattern 400) may be disposed between the substrate 110 and the insulating layer. The auxiliary pattern 400 may overlap the groove 90 along a direction orthogonal to an upper surface of the substrate 110. The organic layer may include the first interlayer insulating layer 160 and the second interlayer insulating layer 180 disposed on the first interlayer insulating layer 160.

According to an exemplary embodiment of the present invention, the organic encapsulation layer 820 may be disposed on the inorganic encapsulation layer 810a in the display area DA and the non-display area NDA. The organic encapsulation layer 820 may fill the groove 90. For example, the organic encapsulation layer 820 may be conformally formed on the common electrode 730 in the blocking region VA.

Figure 4:
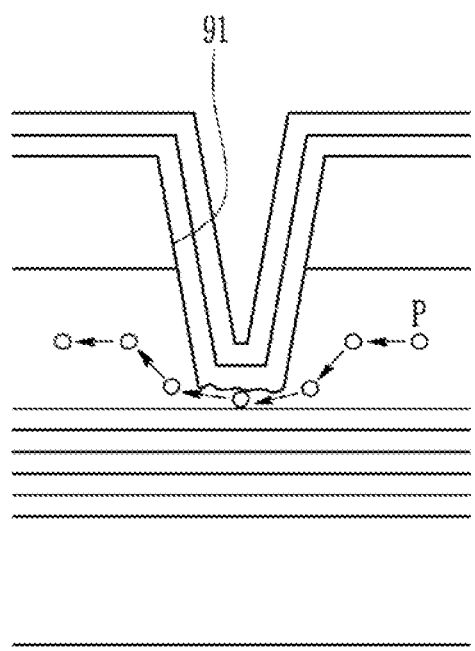
FIG. 4 is a schematic view of an exemplary path of moisture or oxygen.

An example in which an organic material remains in the groove 90 will be described in more detail below with reference to FIG. 4. FIG. 4 is a schematic view of an exemplary path of moisture or oxygen.

Referring to FIG. 4, when forming a groove 91 not overlapping an auxiliary pattern and not in direct contact with an insulating layer below the groove 91, the organic layer may remain in the groove 91, and moisture or oxygen P flowing from the outside may move through the remaining organic layer (e.g., may pass below the groove 91). For example, the organic material remaining in the groove 91 may be a moving path of the moisture or the oxygen P flowing in from the outside.

However, in a display device according to an exemplary embodiment of the present invention, when the groove 90 formed in the blocking region VA is formed to overlap the first auxiliary pattern 400 (e.g., along the direction orthogonal to the upper surface of the substrate 110), the depth of the groove 90 may be shallower while still blocking a penetration of moisture or oxygen. Thus, a possibility of the organic material remaining (e.g., below the groove 90) may be lowered compared with the groove (e.g., groove 91) having the relatively deeper depth when forming the groove through exposure. As an example, decreasing a distance between an insulating layer (e.g., insulating layer 52) below the groove 90 and a bottom level of the groove 90 may prevent moisture or oxygen from flowing through a space below the groove 90. For example, a bottommost level of the groove 90 may be in direct contact with an insulating layer (e.g., insulating layer 52) below the groove 90. Thus, the groove 90 may prevent a penetration of moisture or oxygen, such as a penetration of moisture or oxygen to an emission layer or a signal line of a display device.

Figure 5:
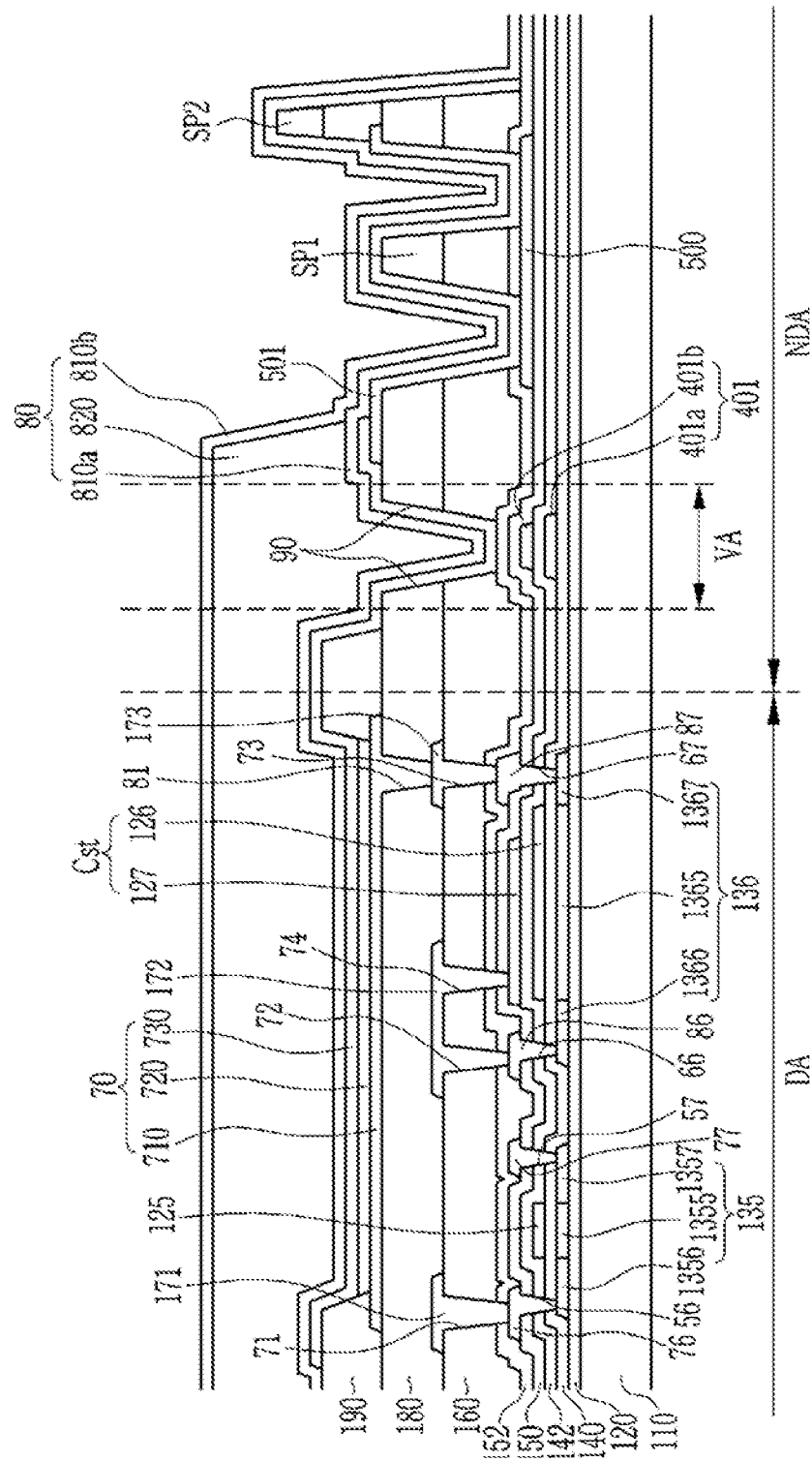
FIG. 5 is a cross-sectional view of a display device according to an exemplary embodiment of the present invention.
Figure 6:
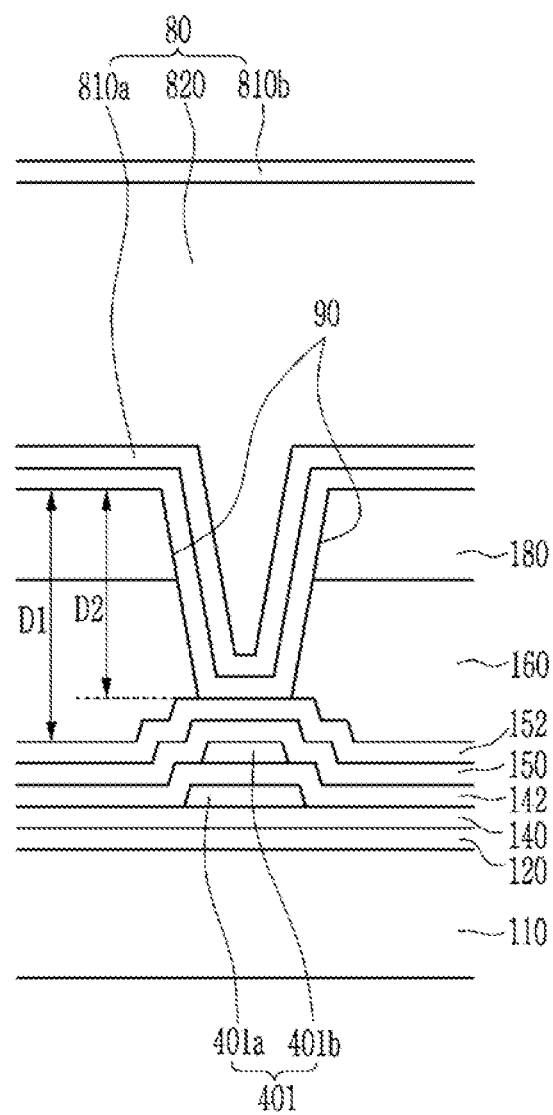
FIG. 6 is a cross-sectional view of a part of FIG. 5.

A display device according to an exemplary embodiment of the present invention will be described in more detail below with reference to FIG. 5 and FIG. 6. FIG. 5 is a cross-sectional view of a display device according to an exemplary embodiment of the present invention. FIG. 6 is a cross-sectional view of a part of FIG. 5.

A display device described with reference to FIG. 5 and FIG. 6 below is similar to the display device described above with reference to FIG. 2 and FIG. 3. Thus, duplicative descriptions of components that are the same or substantially the same as those described above with reference to FIG. 2 and FIG. 3 may be omitted below with reference to FIG. 5 and FIG. 6.

Referring to FIG. 5 and FIG. 6, a display device according to an exemplary embodiment of the present invention may include a second auxiliary pattern 401 disposed in the blocking region VA. The second auxiliary pattern 401 may include a first layer 401a disposed between the first gate insulating layer 140 and the second gate insulating layer 142, and a second layer 401b overlapping the first layer 401a (e.g., along the direction orthogonal to the upper surface of the substrate 110) and disposed between the second gate insulating layer 142 and the first insulating layer 150. The first layer 401a may have a narrower width along a direction parallel to the upper surface of the substrate 110 than a width of the second layer 401b.

The first layer 401a of the second auxiliary pattern 401 may be substantially simultaneously formed with and may include a same material as the first gate electrode 125 and the second gate electrode 126 of the display area DA. The second layer 401b of the second auxiliary pattern 401 may be substantially simultaneously formed with and may include a same material as the storage electrode 127 of the display area DA.

Referring to FIG. 6, the groove 90 formed in the first interlayer insulating layer 160 and the second interlayer insulating layer 180 disposed in the blocking region VA may overlap the first inorganic encapsulation layer 810a and the thin film encapsulation layer 80, the second inorganic encapsulation layer 810b, and the organic encapsulation layer 820 (e.g., along the direction orthogonal to the upper surface of the substrate 110). The groove 90 may overlap the second auxiliary pattern 401 disposed in the blocking region VA (e.g., along the direction orthogonal to the upper surface of the substrate 110).

The groove 90 may be formed in the first interlayer insulating layer 160 and the second interlayer insulating layer 180 disposed in the blocking region VA overlapping the thin film encapsulation layer 80 (e.g., along the direction orthogonal to the upper surface of the substrate 110), and thus external moisture and air may be prevented from flowing into the display area DA covered by the thin film encapsulation layer 80 through the first interlayer insulating layer 160 and the second interlayer insulating layer 180 disposed in the non-display area NDA. Thus, the groove 90 may prevent a penetration of moisture or oxygen, such as a penetration of moisture or oxygen to an emission layer or a signal line of a display device.

The groove 90 may overlap the second auxiliary pattern 401 disposed in the blocking region VA (e.g., along the direction orthogonal to the upper surface of the substrate 110). Since the second auxiliary pattern 401 includes the first layer 401a and the second layer 401b overlapping each other, the first thickness D1 of the first interlayer insulating layer 160 and the second interlayer insulating layer 180 may be larger than the second thickness D2 in which the groove 90 is formed by the step of the first layer 401a and the second layer 401b. Thus, as the height of the groove 90 formed in the first interlayer insulating layer 160 and the second interlayer insulating layer 180 disposed in the blocking region VA is lower than the thickness of the first interlayer insulating layer 160 and the second interlayer insulating layer 180, when forming the groove 90, the organic material may be prevented from remaining, and external moisture and air may be prevented from flowing through the organic material remaining in the groove 90. For example, moisture and oxygen might not flow thorough a space formed below the groove 90.

Figure 7:
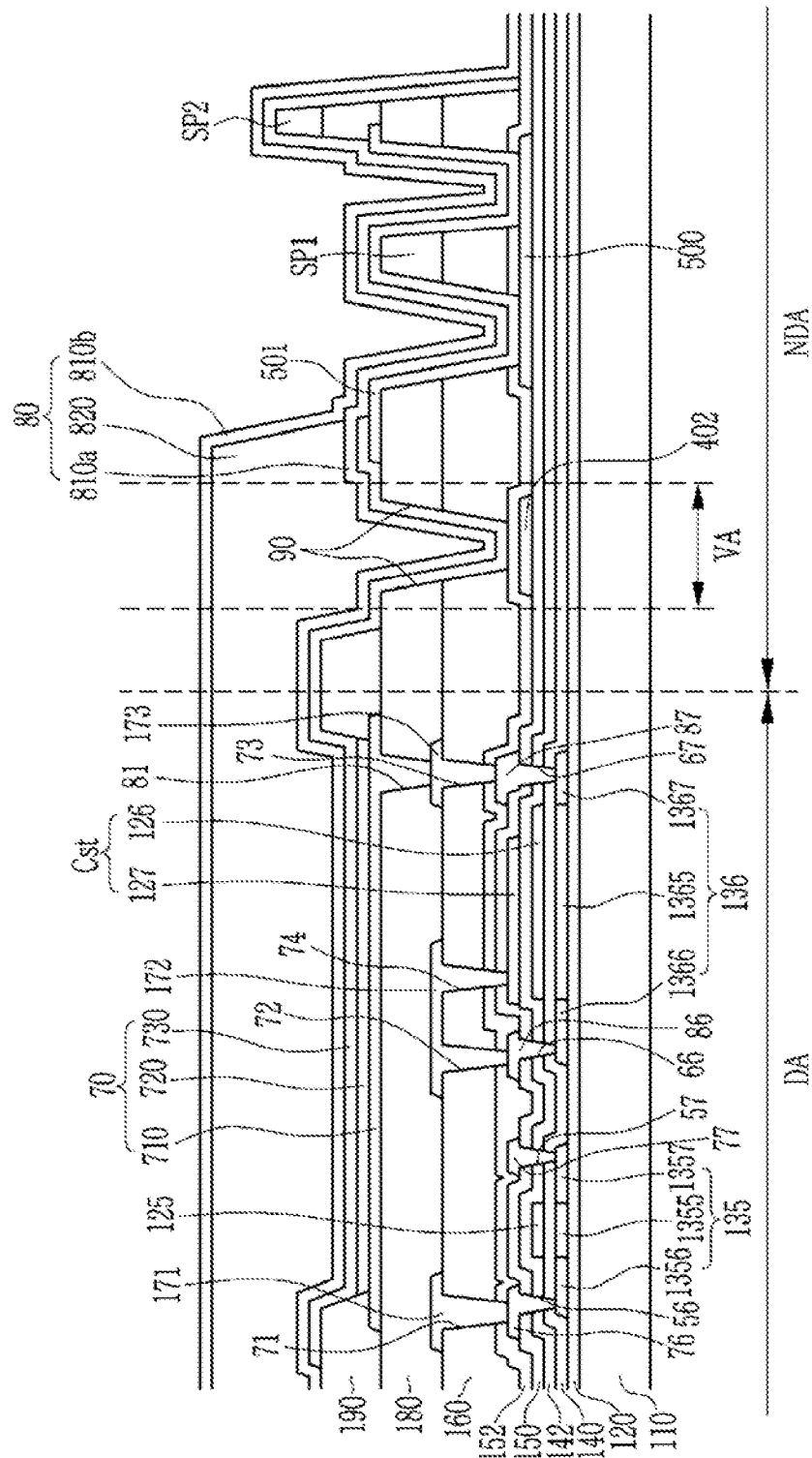
FIG. 7 is a cross-sectional view of a display device according to an exemplary embodiment of the present invention.
Figure 8:
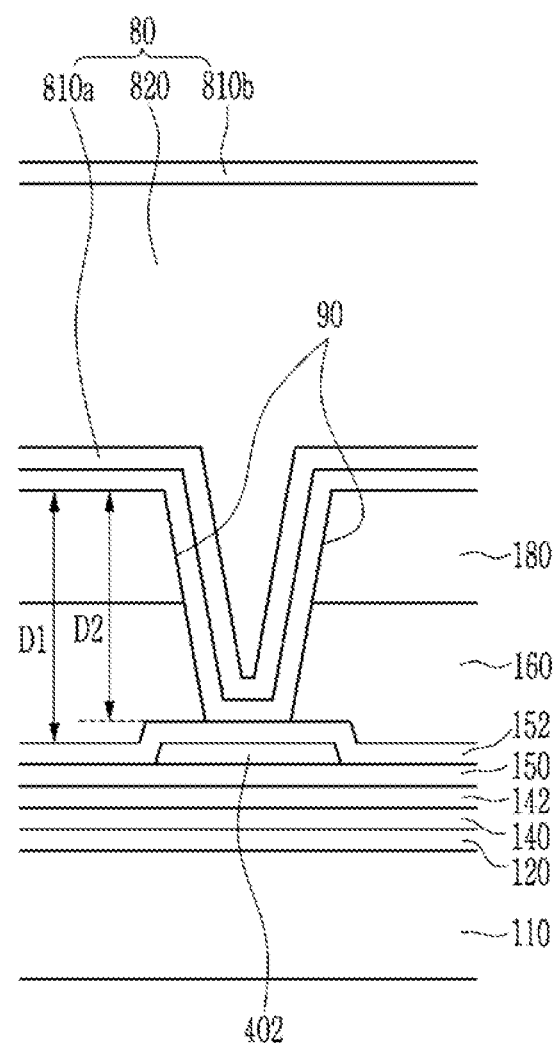
FIG. 8 is a cross-sectional view of a part of FIG. 7.

A display device according to an exemplary embodiment of the present invention will be described in more detail below with reference to FIG. 7 and FIG. 8. FIG. 7 is a cross-sectional view of a display device according to an exemplary embodiment of the present invention. FIG. 8 is a cross-sectional view of a part of FIG. 7.

A display device described with reference to FIG. 7 and FIG. 8, below is similar to the display device described above with reference to FIG. 2 and FIG. 3. Thus, duplicative descriptions of components that are the same or substantially the same as those described above with reference to FIG. 2 and FIG. 3 may be omitted below with reference to FIG. 7 and FIG. 8.

Referring to FIG. 7 and FIG. 8, a display device according to an exemplary embodiment of the present invention may include a third auxiliary pattern 402 disposed in the blocking region VA. The third auxiliary pattern 402 may be disposed between the first insulating layer 150 and the second insulating layer 152. The third auxiliary pattern 402 may be substantially simultaneously formed with and may include a same material as the first input electrode 76, the first output electrode 77, the second input electrode 86, and the second output electrode 87 in the display area DA.

Referring to FIG. 8, the groove 90 formed in the first interlayer insulating layer 160 and the second interlayer insulating layer 180 disposed in the blocking region VA may overlap the first inorganic encapsulation layer 810a and the second inorganic encapsulation layer 810b of the thin film encapsulation layer 80, and the organic encapsulation layer 820 (e.g., along the direction orthogonal to the upper surface of the substrate 110). The groove 90 may overlap the third auxiliary pattern 402 disposed in the blocking region VA (e.g., along the direction orthogonal to the upper surface of the substrate 110).

When the groove 90 is formed in the first interlayer insulating layer 160 and the second interlayer insulating layer 180 disposed in the blocking region VA overlapping the thin film encapsulation layer 80, the external moisture and air may be prevented from flowing into the display area DA covered by the thin film encapsulation layer 80 through the first interlayer insulating layer 160 and the second interlayer insulating layer 180 disposed in the non-display area NDA. Thus, the groove 90 may prevent a penetration of moisture or oxygen, such as a penetration of moisture or oxygen to an emission layer or a signal line of a display device.

The groove 90 may overlap the third auxiliary pattern 402 disposed in the blocking region VA (e.g., along the direction orthogonal to the upper surface of the substrate 110). The first thickness D1 of the first interlayer insulating layer 160 and the second interlayer insulating layer 180 may be larger than the second thickness D2 of which the groove 90 is formed by the step of the third auxiliary pattern 402. Thus, as the height of the groove 90 formed in the first interlayer insulating layer 160 and the second interlayer insulating layer 180 disposed in the blocking region VA is formed to be lower than the thickness of the first interlayer insulating layer 160 and the second interlayer insulating layer 180, when forming the groove 90, the organic material may be prevented from remaining, and the external moisture and air may be prevented from flowing through the organic material remaining in the groove 90. For example, moisture or oxygen might not flow through a space formed below the groove 90. Thus, the groove 90 may prevent a penetration of moisture or oxygen, such as a penetration of moisture or oxygen to an emission layer or a signal line of a display device.

Figure 9:
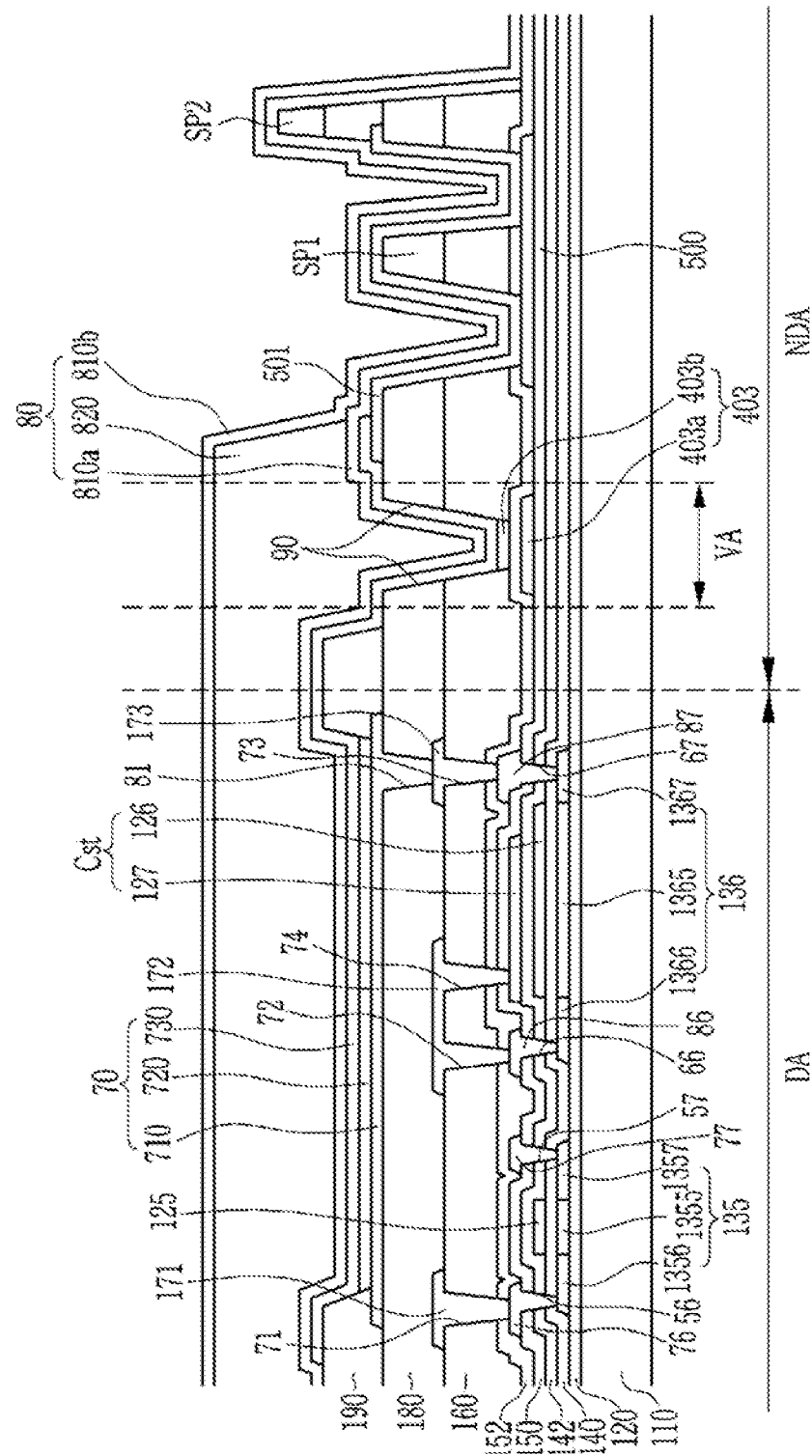
FIG. 9 is a cross-sectional view of a display device according to an exemplary embodiment of the present invention.
Figure 10:
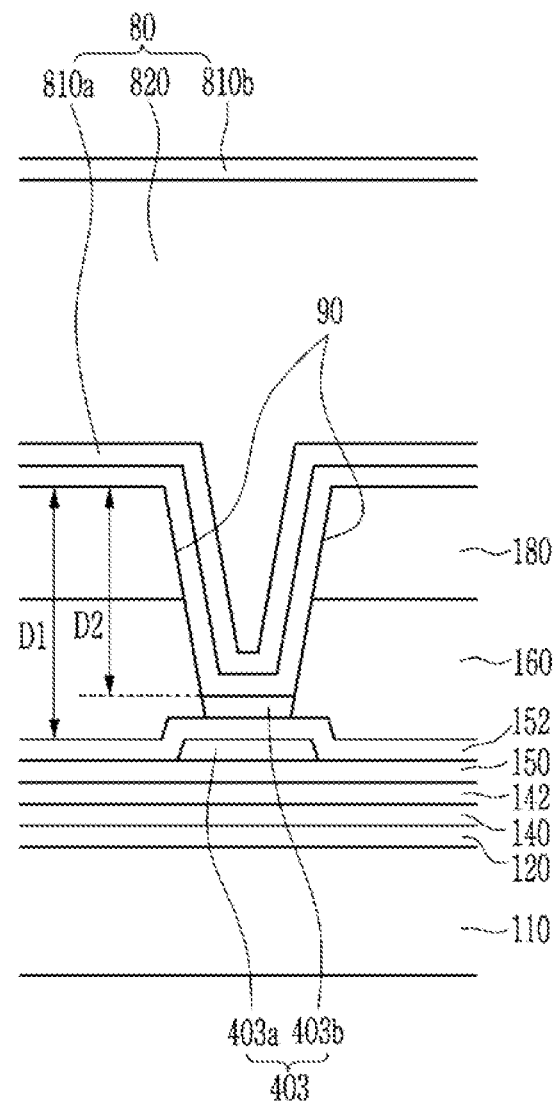
FIG. 10 is a cross-sectional view of a part of FIG. 9.

A display device according to an exemplary embodiment of the present invention will be described in more detail below with reference to FIG. 9 and FIG. 10. FIG. 9 is a cross-sectional view of a display device according to an exemplary embodiment of the present invention. FIG. 10 is a cross-sectional view of a part of FIG. 9.

A display device described with reference to FIG. 9 and FIG. 10 below is similar to the display device described above (e.g., with reference to FIG. 2 and FIG. 3). Thus, duplicative descriptions of components that are the same or substantially the same as those described above (e.g., with reference to FIG. 2 and FIG. 3) may be omitted below with reference to FIG. 9 and FIG. 10.

A display device according to an exemplary embodiment of the present invention may include a fourth auxiliary pattern 403 disposed in the blocking region VA. The fourth auxiliary pattern 403 may include a first layer 403a disposed between the first insulating layer 150 and the second insulating layer 152, and a second layer 403b overlapping the first layer 403a disposed on the second insulating layer 152 (e.g., along the direction orthogonal to the upper surface of the substrate 110).

The first layer 403a of the fourth auxiliary pattern 403 may be substantially simultaneously formed with and may include a same material as the first input electrode 76, the first output electrode 77, the second input electrode 86, and the second output electrode 87 of the display area DA. The second layer 403b of the fourth auxiliary pattern 403 may be substantially simultaneously formed with and may include a same material as the data line 171, the driving voltage line 172, and the output member 173 of the display area DA.

Referring to FIG. 10, the groove 90 formed in the first interlayer insulating layer 160 and the second interlayer insulating layer 180 disposed in the blocking region VA may overlap the first inorganic encapsulation layer 810a of the thin film encapsulation layer 80, the second inorganic encapsulation layer 810b, and the organic encapsulation layer 820 (e.g., along the direction orthogonal to the upper surface of the substrate 110). The groove 90 may overlap the fourth auxiliary pattern 403 disposed in the blocking region VA (e.g., along the direction orthogonal to the upper surface of the substrate 110).

When the groove 90 is formed in the first interlayer insulating layer 160 and the second interlayer insulating layer 180 disposed in the blocking region VA overlapping the thin film encapsulation layer 80, external moisture and air may be prevented from flowing into the display area DA covered by the thin film encapsulation layer 80 through the first interlayer insulating layer 160 and the second interlayer insulating layer 180 disposed in the non-display area NDA.

The groove 90 may overlap the fourth auxiliary pattern 403 disposed in the blocking region VA. Since the fourth auxiliary pattern 403 includes the first layer 403a and the second layer 403b overlapping each other, the first thickness D1 of the first interlayer insulating layer 160 and the second interlayer insulating layer 180 may be larger than the second thickness D2 of which the groove 90 is formed by the step of the first layer 403a and the second layer 403b of the fourth auxiliary pattern 403. Thus, as the height of the groove 90 formed in the first interlayer insulating layer 160 and the second interlayer insulating layer 180 disposed in the blocking region VA is formed to be lower than the thickness of the first interlayer insulating layer 160 and the second interlayer insulating layer 180, when forming the groove 90, the organic material may be prevented from remaining, and the external moisture and air may be prevented from flowing through the organic material remaining in the groove 90. For example, moisture and oxygen might not flow through a space below the groove 90. Thus, the groove 90 may prevent a penetration of moisture or oxygen, such as a penetration of moisture or oxygen to an emission layer or a signal line of a display device.

Figure 11:
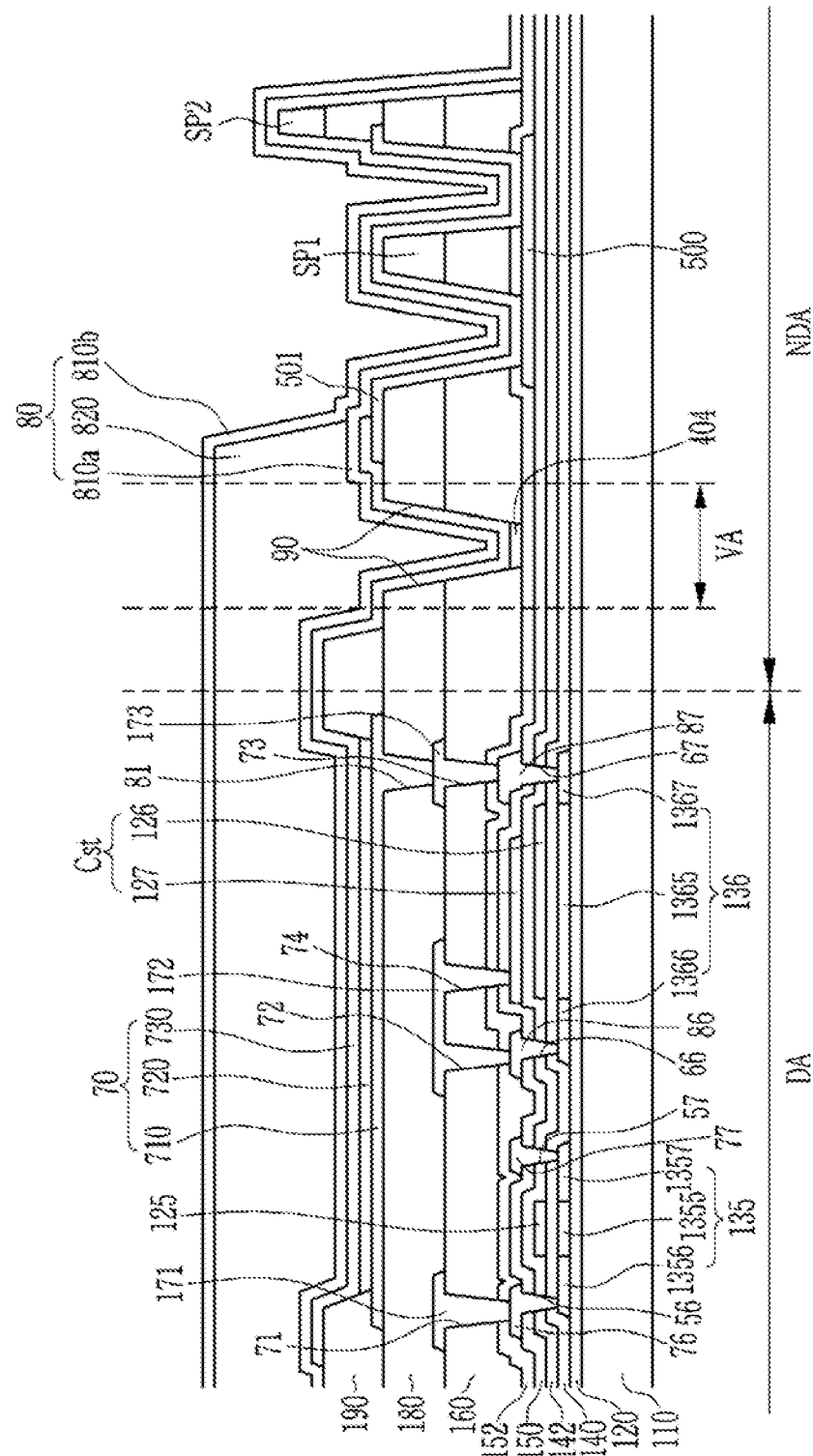
FIG. 11 is a cross-sectional view of a display device according to an exemplary embodiment of the present invention
Figure 12:
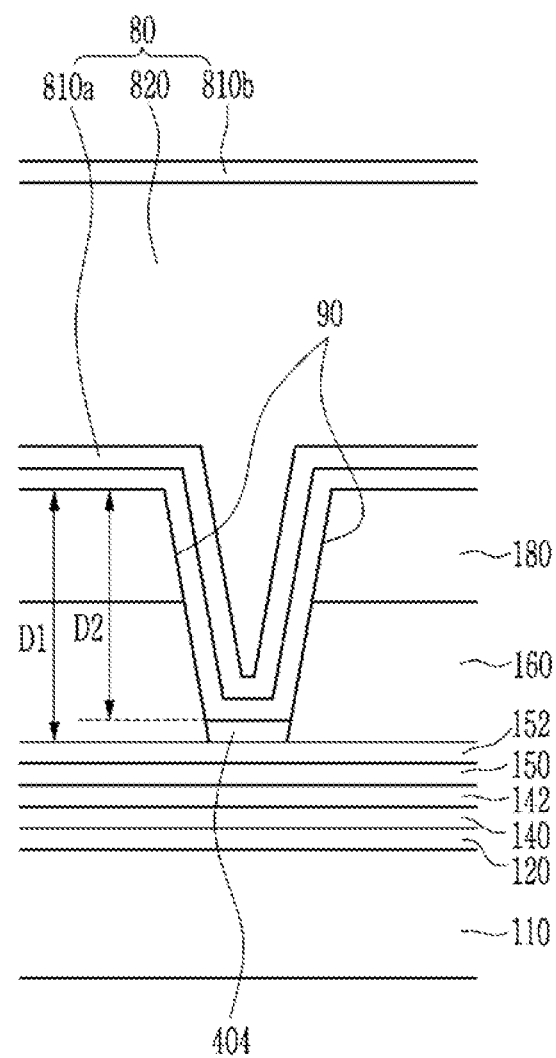
FIG. 12 is a cross-sectional view of a part of FIG. 11.

A display device according to an exemplary embodiment of the present invention will be described in more detail below with reference to FIG. 11 and FIG. 12. FIG. 11 is a cross-sectional view of a display device according to an exemplary embodiment of the present invention. FIG. 12 is a cross-sectional view of a part of FIG. 11.

A display device described with reference to FIG. 11 and FIG. 12 below is similar to the display devices described above (e.g., with reference to FIG. 2 and FIG. 3). Thus, duplicative descriptions of components that are the same or substantially the same as those described above (e.g., with reference to FIG. 2 and FIG. 3) may be omitted below with reference to FIG. 11 and FIG. 12.

Referring to FIG. 11 and FIG. 12, a display device according to an exemplary embodiment of the present invention may include a fifth auxiliary pattern 404 disposed in the blocking region VA. The fifth auxiliary pattern 404 may be disposed on the second insulating layer 152. The fifth auxiliary pattern 404 may be substantially simultaneously formed with and may include a same material as the data line 171, the driving voltage line 172, and the output member 173 of the display area DA.

Referring to FIG. 12, the groove 90 formed in the first interlayer insulating layer 160 and the second interlayer insulating layer 180 disposed in the blocking region VA may overlap the first inorganic encapsulation layer 810a of the thin film encapsulation layer 80, the second inorganic encapsulation layer 810b, and the organic encapsulation layer 820 (e.g., along the direction orthogonal to the upper surface of the substrate 110). The groove 90 may overlap the fifth auxiliary pattern 404 disposed in the blocking region VA (e.g., along the direction orthogonal to the upper surface of the substrate 110).

When the groove 90 is formed in the first interlayer insulating layer 160 and the second interlayer insulating layer 180 disposed in the blocking region VA overlapping the thin film encapsulation layer 80, external moisture and air may be prevented from flowing into the display area DA covered by the thin film encapsulation layer 80 through the first interlayer insulating layer 160 and the second interlayer insulating layer 180 disposed in the non-display area NDA.

The groove 90 may overlap the fifth auxiliary pattern 404 disposed in the blocking region VA (e.g., along the direction orthogonal to the upper surface of the substrate 110). The first thickness D1 of the first interlayer insulating layer 160 and the second interlayer insulating layer 180 may be larger than the second thickness D2 in which the groove 90 is formed by the step of the fifth auxiliary pattern 404. Thus, as the height of the groove 90 formed in the first interlayer insulating layer 160 and the second interlayer insulating layer 180 disposed in the blocking region VA is formed to be lower than the thickness of the first interlayer insulating layer 160 and the second interlayer insulating layer 180, when forming the groove 90, the organic material may be prevented from remaining, and the moisture and air may be prevented from flowing through the organic material remaining in the groove 90. For example, moisture or oxygen might not flow through a space formed below the groove 90. Thus, the groove 90 may prevent a penetration of moisture or oxygen, such as a penetration of moisture or oxygen to an emission layer or a signal line of a display device.

Figure 13:
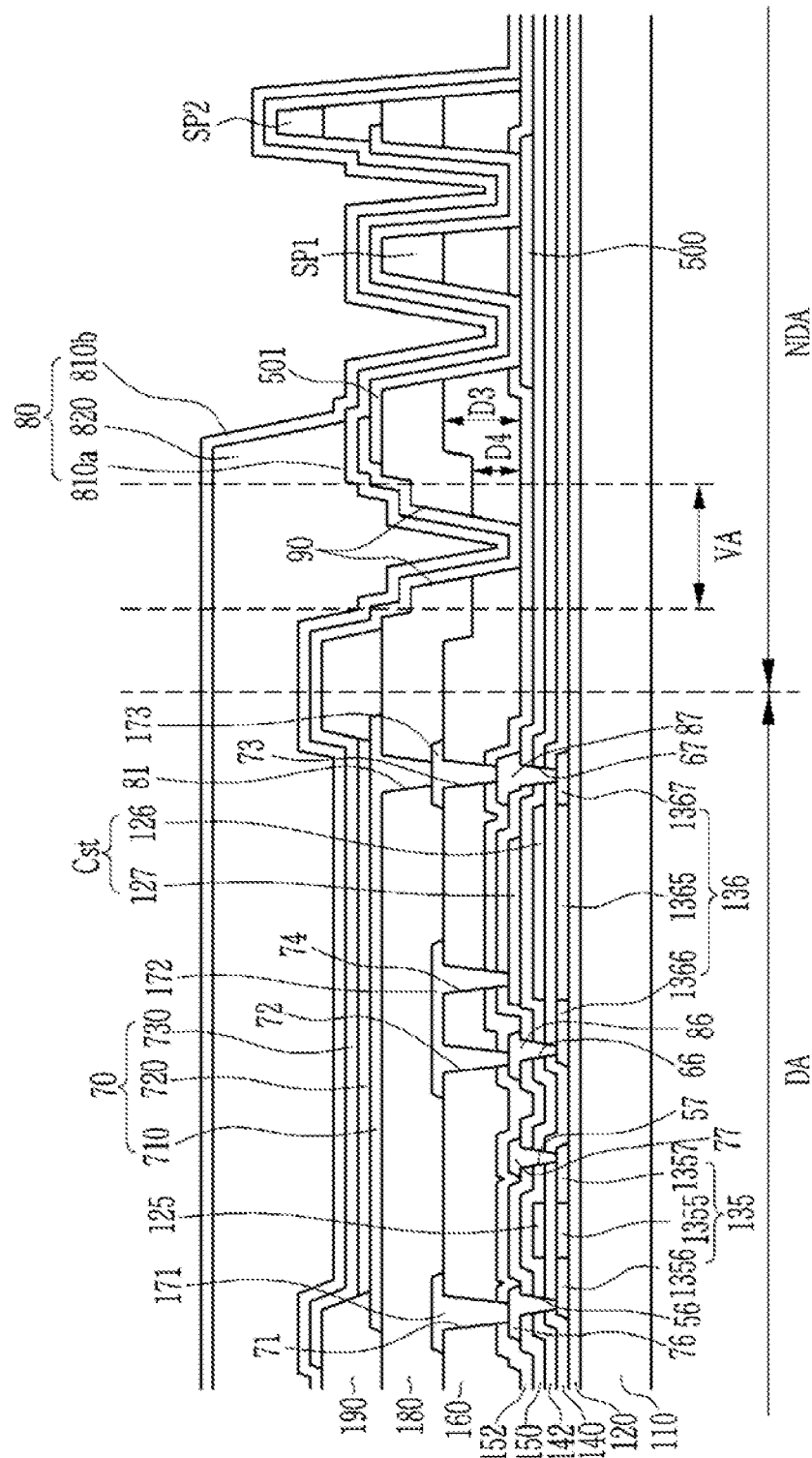
FIG. 13 is a cross-sectional view of a display device according to an exemplary embodiment of the present invention.
Figure 14:
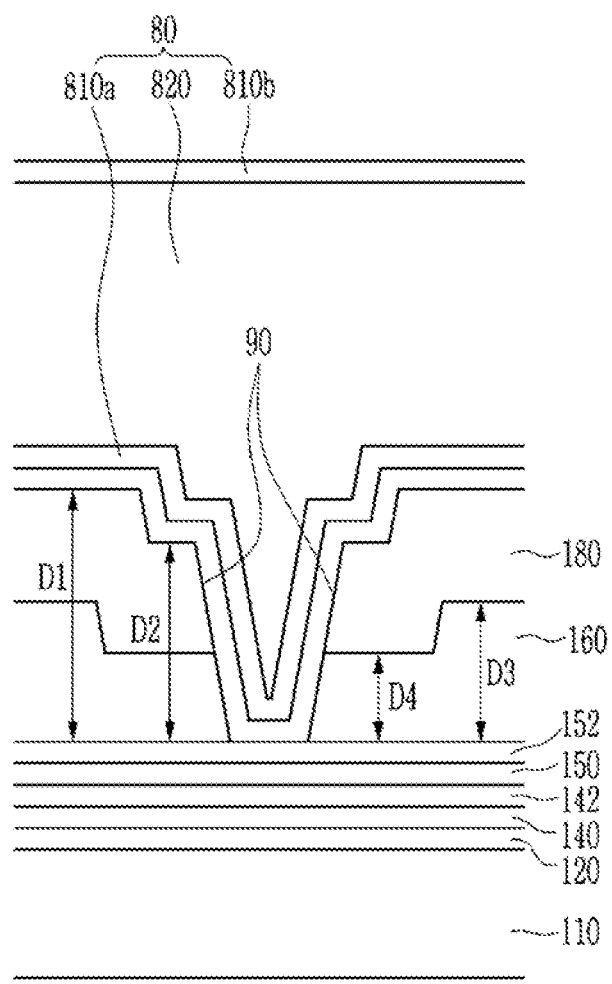
FIG. 14 is a cross-sectional view of a part of FIG. 13.

A display device according to an exemplary embodiment of the present invention will be described in more detail below with reference to FIG. 13 and FIG. 14. FIG. 13 is a cross-sectional view of a display device according to an exemplary embodiment of the present invention. FIG. 14 is a cross-sectional view of a part of FIG. 13.

A display device described with reference to FIG. 13 and FIG. 14 below is similar to the display devices described above (e.g., with reference to FIG. 2 and FIG. 3). Thus, duplicative descriptions of components that are the same or substantially the same as those described above (e.g., with reference to FIG. 2 and FIG. 3) may be omitted below with reference to FIG. 13 and FIG. 14.

In a display device according to an exemplary embodiment of the present invention, the thickness of the first interlayer insulating layer 160 disposed in the blocking region VA may be smaller than in regions immediately adjacent to the blocking region VA. For example, a fourth thickness D4 of the first interlayer insulating layer 160 disposed in the blocking region VA may be smaller than the third thickness D3 of the first interlayer insulating layer 160 disposed in the non-display area NDA except for the display area DA and the blocking region VA.

As an example, as the thickness of the first interlayer insulating layer 160 disposed in the blocking region VA is formed to be lowered, the second thickness D2 of the groove 90 formed in the blocking region VA may be formed lower than the first thickness D1 of the first interlayer insulating layer 160 and the second interlayer insulating layer 180 disposed in the display area DA.

When the groove 90 is formed in the first interlayer insulating layer 160 and the second interlayer insulating layer 180 disposed in the blocking region VA overlapping the thin film encapsulation layer 80 (e.g., along the direction orthogonal to the upper surface of the substrate 110), moisture and air may be prevented from flowing into the display area DA covered by the thin film encapsulation layer 80 through the first interlayer insulating layer 160 and the second interlayer insulating layer 180 disposed in the non-display area NDA. As the height of the groove 90 formed in the first interlayer insulating layer 160 and the second interlayer insulating layer 180 disposed in the blocking region VA is formed to be lower than the thickness of the first interlayer insulating layer 160 and the second interlayer insulating layer 180, when forming the groove 90, the organic material may be prevented from remaining, and moisture and air may be prevented from flowing through the organic material remaining in the groove 90. For example, moisture or oxygen might not flow through a space formed below the groove 90. Thus, the groove 90 may prevent a penetration of moisture or oxygen, such as a penetration of moisture or oxygen to an emission layer or a signal line of a display device.

In an exemplary embodiment of the present invention, only the thickness of the first interlayer insulating layer 160 is low in the blocking region VA, however exemplary embodiments of the present invention are not limited thereto, and the thickness of at least one interlayer insulating layer of the first interlayer insulating layer 160 and the second interlayer insulating layer 180 may be lower in the blocking region VA.

Figure 15:
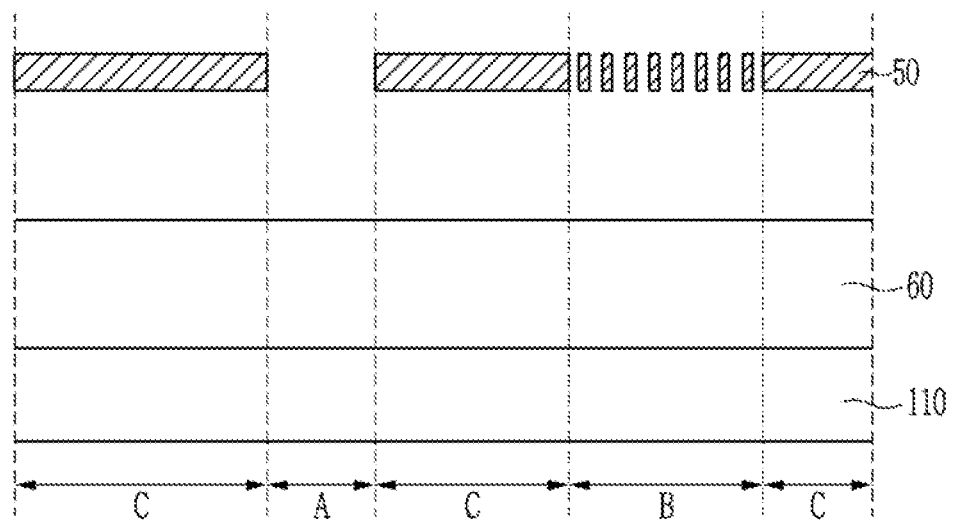
FIG. 15 illustrates a manufacturing method of a display device according to an exemplary embodiment of the present invention.

A method of differentiating the thickness of the interlayer insulating layer will be described in more detail below with reference to FIG. 15. FIG. 15 illustrates a manufacturing method of a display device according to an exemplary embodiment of the present invention.

Referring to FIG. 15, an exposure mask 50 may have a transparent region A, a semi-transparent region B, and a light blocking region C. A photosensitive layer 60 may be deposited on the substrate 110 and may be exposed by using the exposure mask 50 having the transparent region A, the semi-transparent region B, and the light blocking region C, Light may be applied to the photosensitive layer 60 disposed in the transparent region A, light might not be applied to the photosensitive layer 60 disposed in the light blocking region C, and light may be partially applied to the photosensitive layer 60 disposed in the semi-transparent region B.

When the photosensitive layer 60 has negative photosensitivity, as the photosensitive layer 60 exposed through the exposure mask 50 is developed, the photosensitive layer 60 disposed in the transparent region A may be substantially completely removed, the photosensitive layer 60 disposed in the semi-transparent region B may only be partially removed so that the thickness of the photosensitive layer 60 is reduced, and the photosensitive layer 60 disposed in the light blocking region C may substantially remain without a change of the thickness. When the photosensitive layer 60 has positive photosensitivity, as the photosensitive layer 60 exposed through the exposure mask 50 is developed, the photosensitive layer 60 disposed in the transparent region A may substantially remain without a change of the thickness, the photosensitive layer 60 disposed in the semi-transparent region B may only be partially removed so that the thickness of the photosensitive layer 60 is reduced, and the photosensitive layer 60 disposed in the light blocking region C may be substantially completely removed. For example, the region where the photosensitive layer 60 is substantially completely removed may correspond to the region where the contact holes 71, 72, 73, and 74 of the first interlayer insulating layer 160 are formed, the region where the photosensitive layer 60 is partially removed so that the thickness of the photosensitive layer 60 may correspond to the first interlayer insulating layer 160 disposed in the blocking region VA and having the fourth thickness D4, and the region where the photosensitive layer 60 substantially remains without a change of the thickness may correspond to the region where the first interlayer insulating layer 160 having the third thickness D3 without the contact holes 71, 72, 73, and 74 is disposed.

Thus, as the photosensitive film pattern having three regions having the different thicknesses is formed by using a half-tone mask, the first interlayer insulating layer 160 may be etched by using this photosensitive film pattern, and then the height of the photosensitive film pattern may be reduced, and the first interlayer insulating layer 160 may be etched, the contact holes 71, 72, 73, and 74 may be formed in the first interlayer insulating layer 160, and substantially simultaneously the first interlayer insulating layer 160 having the fourth thickness D4 smaller than the third thickness D3 may be formed by lowering the height of the first interlayer insulating layer 160 disposed in the blocking region VA.

Alternatively, the organic material layer itself forming the first interlayer insulating layer 160 may have photosensitivity.

Referring to FIG. 15, the semi-transparent region B of the exposure mask 50 may have a slit, however the semi-transparent region B of the exposure mask 50 may have a relatively thin thickness.

Figure 16:
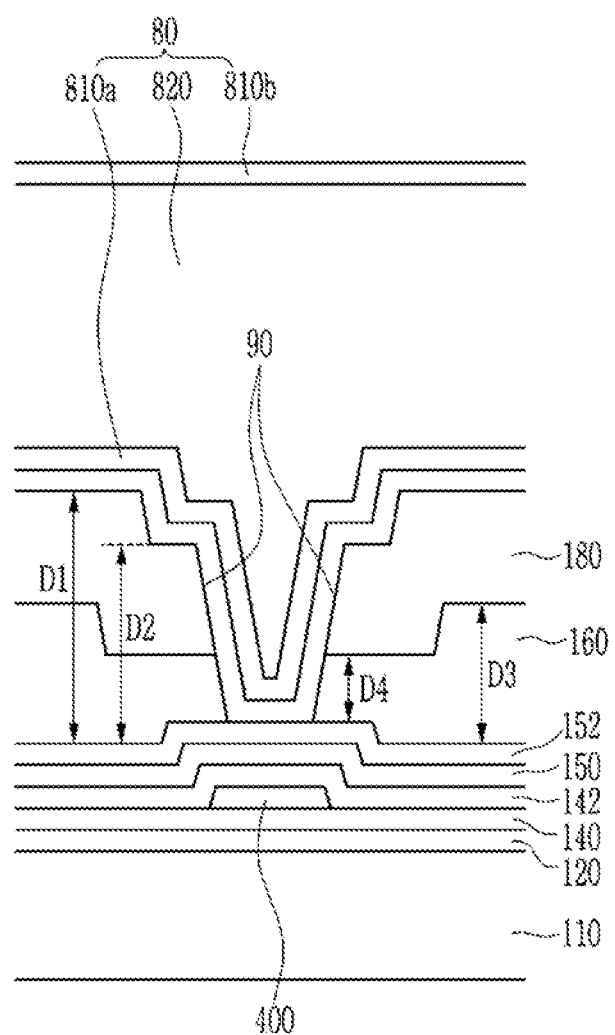
FIG. 16 is a cross-sectional view of a part of a display device according to an exemplary embodiment of the present invention.

A display device according to an exemplary embodiment of the present invention is described in more detail below with reference to FIG. 16. FIG. 16 is a cross-sectional view of a part of a display device according to an exemplary embodiment of the present invention.

A display device described with reference to FIG. 16 below is similar to the display devices above (e.g., with reference to FIG. 2 and FIG. 3). Thus, duplicative descriptions of components that are the same or substantially the same as those described above (e.g., with reference to FIG. 2 and FIG. 3) may be omitted below with reference to FIG. 16.

Referring to FIG. 16, a display device according to an exemplary embodiment of the present invention may include the first auxiliary pattern 400 disposed in the blocking region VA, and the fourth thickness D4 of the first interlayer insulating layer 160 disposed in the blocking region VA may be smaller than the third thickness D3 of the first interlayer insulating layer 160 disposed in the non-display area NDA except for the display area DA and the blocking region VA. The groove 90 may be formed in the first interlayer insulating layer 160 and the second interlayer insulating layer 180 disposed in the blocking region VA, and the groove 90 may overlap the first auxiliary pattern 400 disposed in the blocking region VA (e.g., along the direction orthogonal to the upper surface of the substrate 110). The first auxiliary pattern 400 may be substantially simultaneously formed with and may include a same material as the first gate electrode 125 and the second gate electrode 126 disposed in the display area DA.

When the groove 90 is formed in the first interlayer insulating layer 160 and the second interlayer insulating layer 180 disposed in the blocking region VA overlapping the thin film encapsulation layer 80, moisture and air may be prevented from flowing into the display area DA covered by the thin film encapsulation layer 80 through the first interlayer insulating layer 160 and the second interlayer insulating layer 180 disposed in the non-display area NDA.

When the groove 90 may overlap the first auxiliary pattern 400 disposed in the blocking region VA and the thickness of the first interlayer insulating layer 160 disposed in the blocking region VA may be lowered, and the second thickness D2 of the groove 90 formed in the blocking region VA may be lower than the first thickness D1 of the first interlayer insulating layer 160 and the second interlayer insulating layer 180 disposed in the display area DA, when forming the groove 90, and thus the organic material may be prevented from remaining, and moisture and air may be prevented from flowing through the organic material remaining in the groove 90. For example, moisture or oxygen might not flow through a space formed below the groove 90. Thus, the groove 90 may prevent a penetration of moisture or oxygen, such as a penetration of moisture or oxygen to an emission layer or a signal line of a display device.

In an exemplary embodiment of the present invention, the thickness of the first interlayer insulating layer 160 may be low in the blocking region VA, however exemplary embodiments of the present invention are not limited thereto, and the thickness of at least one interlayer insulating layer of the first interlayer insulating layer 160 and the second interlayer insulating layer 180 may be lowered in the blocking region VA.

Figure 17:
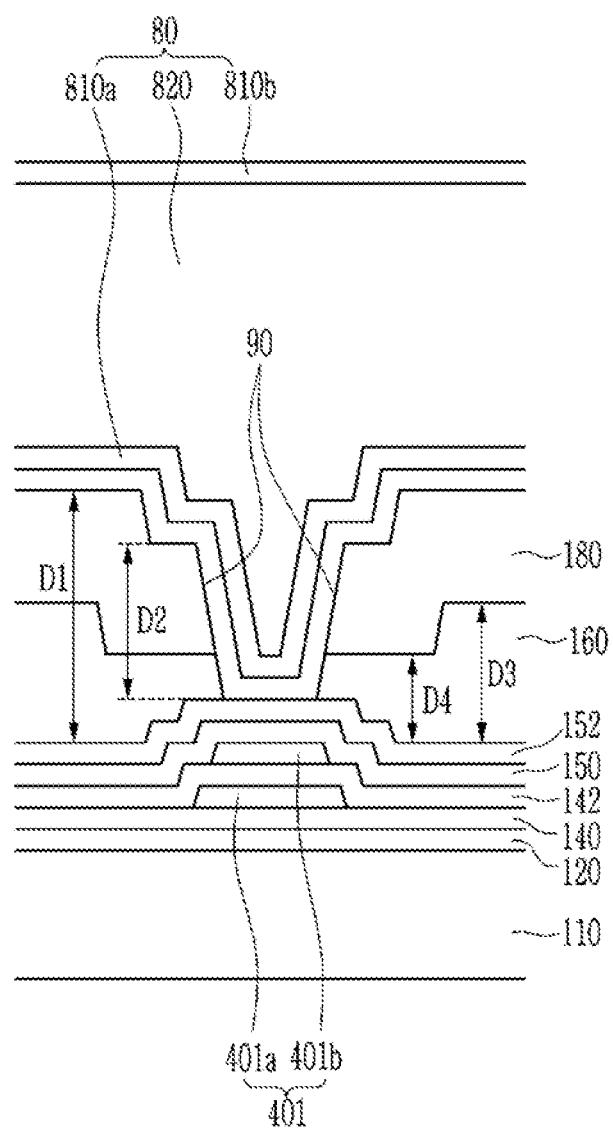
FIG. 17 is a cross-sectional view of a part of a display device according to an exemplary embodiment of the present invention.

A display device according to an exemplary embodiment of the present invention is described in more detail below with reference to FIG. 17. FIG. 17 is a cross-sectional view of a part of a display device according to an exemplary embodiment of the present invention.

A display device described with reference to below is similar to the display device described above (e.g., with reference to FIG. 2 and FIG. 3). Thus, duplicative descriptions of components that are the same or substantially the same as those described above (e.g., with reference to FIG. 2 and FIG. 3) may be omitted below with reference to FIG. 17.

A display device according to an exemplary embodiment of the present invention may include the second auxiliary pattern 401 disposed in the blocking region VA, and the fourth thickness D4 of the first interlayer insulating layer 160 disposed in the blocking region VA may be smaller than the third thickness D3 of the first interlayer insulating layer 160 disposed in the non-display area NDA except for the display area DA and the blocking region VA. The groove 90 may be formed in the first interlayer insulating layer 160 and the second interlayer insulating layer 180 disposed in the blocking region VA, and the groove 90 may overlap the second auxiliary pattern 401 disposed in the blocking region VA (e.g., along the direction orthogonal to the upper surface of the substrate 110).

The second auxiliary pattern 401 may include the first layer 401a disposed between the first gate insulating layer 140 and the second gate insulating layer 142, and the second layer 401b overlapping the first layer 401a and disposed between the second gate insulating layer 142 and the first insulating layer 150.

The first layer 401a of the second auxiliary pattern 401 may be substantially simultaneously formed with and may include a same material as the first gate electrode 125 and the second gate electrode 126 of the display area DA, and the second layer 401b of the second auxiliary pattern 401 may be substantially simultaneously formed with and may include a same material as the storage electrode 127 of the display area DA.

When the groove 90 is formed in the first interlayer insulating layer 160 and the second interlayer insulating layer 180 disposed in the blocking region VA overlapping the thin film encapsulation layer 80, moisture and air may be prevented from flowing into the display area DA covered by the thin film encapsulation layer 80 through the first interlayer insulating layer 160 and the second interlayer insulating layer 180 disposed in the non-display area NDA.

The groove 90 may overlap the second auxiliary pattern 401 disposed in the blocking region VA and the thickness of the first interlayer insulating layer 160 disposed in the blocking region VA may be lowered, and the second thickness D2 of the groove 90 formed in the blocking region VA may be formed lower than the first thickness D1 of the first interlayer insulating layer 160 and the second interlayer insulating layer 180 disposed in the display area DA, when forming the groove 90, the organic material may be prevented from remaining, and the moisture and air may be prevented from flowing through the organic material remaining in the groove 90. For example, moisture or oxygen might not flow through a space formed below the groove 90. Thus, the groove 90 may prevent a penetration of moisture or oxygen, such as a penetration of moisture or oxygen to an emission layer or a signal line of a display device.

In an exemplary embodiment of the present invention, the thickness of the first interlayer insulating layer 160 may be relatively low in the blocking region VA, however exemplary embodiments of the present invention are not limited thereto, and the thickness of at least one interlayer insulating layer of the first interlayer insulating layer 160 and the second interlayer insulating layer 180 may be lowered in the blocking region VA.

Figure 18:
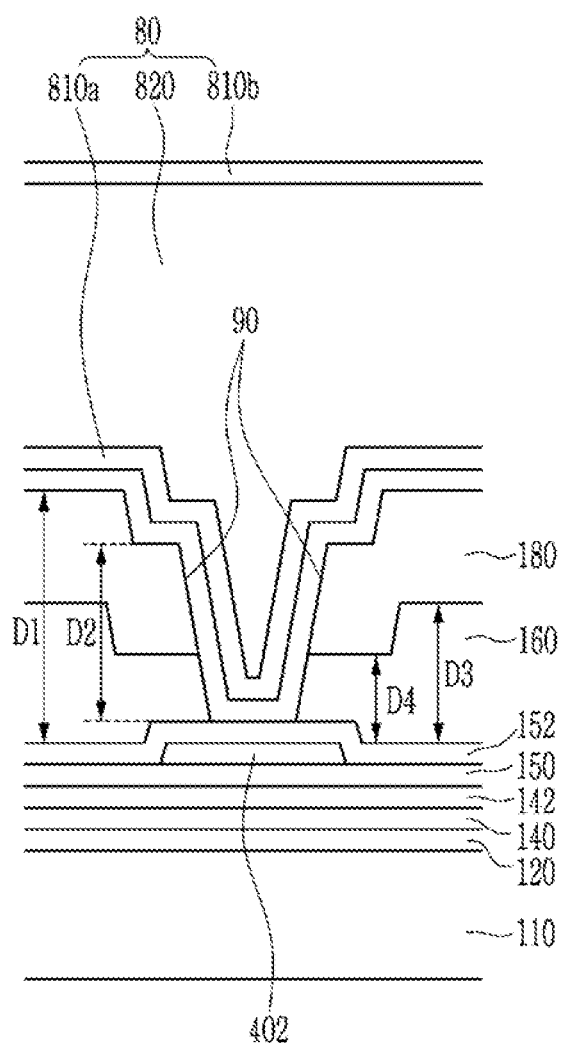
FIG. 18 is a cross-sectional view of a part of a display device according to an exemplary embodiment of the present invention.

The display device according to an exemplary embodiment of the present invention will be described in more detail below with reference to FIG. 18. FIG. 18 is a cross-sectional view of a part of a display device according to an exemplary embodiment of the present invention.

A display device described with reference to FIG. 18 below is similar to the display devices described above (e.g., with reference to FIG. 2 and FIG. 3). Thus, duplicative descriptions of components that are the same or substantially the same as those described above (e.g., with reference to FIG. 2 and FIG. 3) may be omitted below with reference to FIG. 18.

Referring to FIG. 18, a display device according to an exemplary embodiment of the present invention may include the third auxiliary pattern 402 disposed in the blocking region VA, and the fourth thickness D4 of the first interlayer insulating layer 160 disposed in the blocking region VA may be smaller than the third thickness D3 of the first interlayer insulating layer 160 disposed in the non-display area NDA except for the display area DA and the blocking region VA. The groove 90 may be formed in the first interlayer insulating layer 160 and the second interlayer insulating layer 180 disposed in the blocking region VA, and the groove 90 may overlap the third auxiliary pattern 402 disposed in the blocking region VA (e.g., along the direction orthogonal to the upper surface of the substrate 110).

The third auxiliary pattern 402 may be disposed between the first insulating layer 150 and the second insulating layer 152. The third auxiliary pattern 402 may be substantially simultaneously formed with and may include a same material as the first input electrode 76, the first output electrode 77, the second input electrode 86, and the second output electrode 87 of the display area DA.

When the groove 90 is formed in the first interlayer insulating layer 160 and the second interlayer insulating layer 180 disposed in the blocking region VA overlapping the thin film encapsulation layer 80, moisture and air may be prevented from flowing into the display area DA covered by the thin film encapsulation layer 80 through the first interlayer insulating layer 160 and the second interlayer insulating layer 180 disposed in the non-display area NDA.

The groove 90 may overlap the third auxiliary pattern 402 disposed in the blocking region VA and the thickness of the first interlayer insulating layer 160 disposed in the blocking region VA may be lowered, and the second thickness D2 of the groove 90 formed in the blocking region VA may be lower than the first thickness D1 of the first interlayer insulating layer 160 and the second interlayer insulating layer 180 disposed in the display area DA, when forming the groove 90, the organic material may be prevented from remaining, and moisture and air may be prevented from flowing through the organic material remaining in the groove 90. For example, moisture or oxygen might not flow through a space formed below the groove 90. Thus, the groove 90 may prevent a penetration of moisture or oxygen, such as a penetration of moisture or oxygen to an emission layer or a signal line of a display device.

In an exemplary embodiment of the present invention, the thickness of the first interlayer insulating layer 160 may be relatively low in the blocking region VA, however exemplary embodiments of the present invention are not limited thereto, and the thickness of at least one interlayer insulating layer of the first interlayer insulating layer 160 and the second interlayer insulating layer 180 may be lowered in the blocking region VA.

Figure 19:
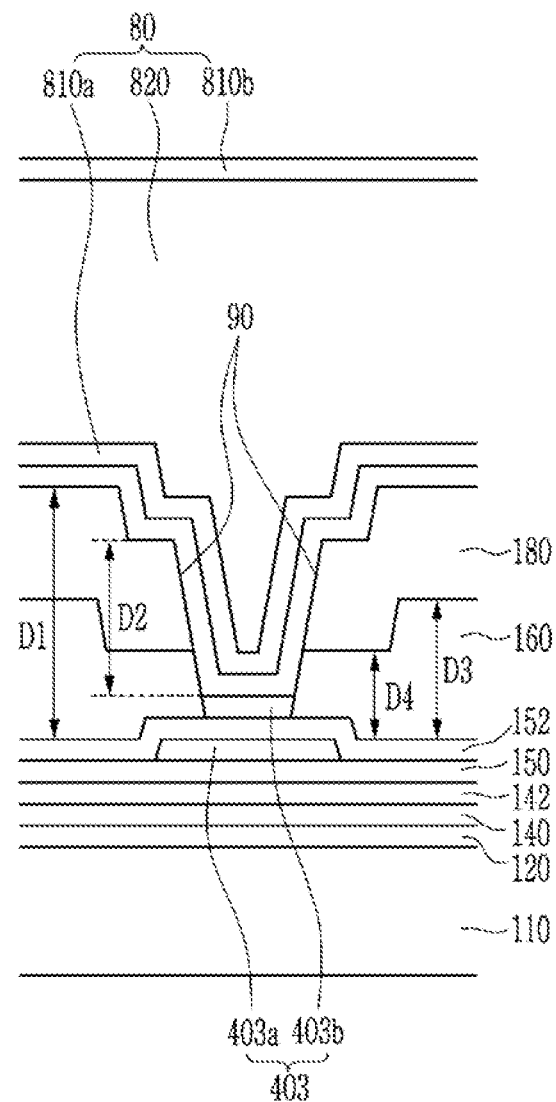
FIG. 19 is a cross-sectional view of a part of a display device according to an exemplary embodiment of the present invention.

A display device according to an exemplary embodiment of the present invention will be described in more detail below with reference to FIG. 19. FIG. 19 is a cross-sectional view of a part of a display device according to an exemplary embodiment of the present invention.

A display device described with reference to FIG. 19 below is similar to the display device described above (e.g., with reference to FIG. 2 and FIG. 3). Thus, duplicative descriptions of components that are the same or substantially the same as those described above (e.g., with reference to FIG. 2 and FIG. 3) may be omitted below with reference to FIG. 19.

A display device according to an exemplary embodiment of the present invention may include the fourth auxiliary pattern 403 disposed in the blocking region VA, and the fourth thickness D4 of the first interlayer insulating layer 160 disposed in the blocking region VA may be smaller than the third thickness D3 of the first interlayer insulating layer 160 disposed in the non-display area NDA except for the display area DA and the blocking region VA. The groove 90 may be formed in the first interlayer insulating layer 160 and the second interlayer insulating layer 180 disposed in the blocking region VA, and the groove 90 may overlap the fourth auxiliary pattern 403 disposed in the blocking region VA (e.g., along the direction orthogonal to the upper surface of the substrate 110).

The fourth auxiliary pattern 403 may include the first layer 403a disposed between the first insulating layer 150 and the second insulating layer 152 and the second layer 403b overlapping the first layer 403a and disposed on the second insulating layer 152.

When the groove 90 is formed in the first interlayer insulating layer 160 and the second interlayer insulating layer 180 disposed in the blocking region VA overlapping the thin film encapsulation layer 80, moisture and air may be prevented from flowing into the display area DA covered by the thin film encapsulation layer 80 through the first interlayer insulating layer 160 and the second interlayer insulating layer 180 disposed in the non-display area NDA.

The groove 90 may overlap the fourth auxiliary pattern 403 disposed in the blocking region VA and the thickness of the first interlayer insulating layer 160 disposed in the blocking region VA may be lowered, and the second thickness D2 of the groove 90 formed in the blocking region VA may be lower than the first thickness D1 of the first interlayer insulating layer 160 and the second interlayer insulating layer 180 disposed in the display area DA, when forming the groove 90, the organic material may be prevented from remaining, and moisture and air may be prevented from flowing through the organic material remaining in the groove 90. For example, moisture or oxygen might not flow through a space formed below the groove 90. Thus, the groove 90 may prevent a penetration of moisture or oxygen, such as a penetration of moisture or oxygen to an emission layer or a signal line of a display device.

In an exemplary embodiment of the present invention, the thickness of the first interlayer insulating layer 160 may be relatively low in the blocking region VA, however exemplary embodiments of the present invention are not limited thereto, and the thickness of at least one interlayer insulating layer of the first interlayer insulating layer 160 and the second interlayer insulating layer 180 may be lowered in the blocking region VA.

Figure 20:
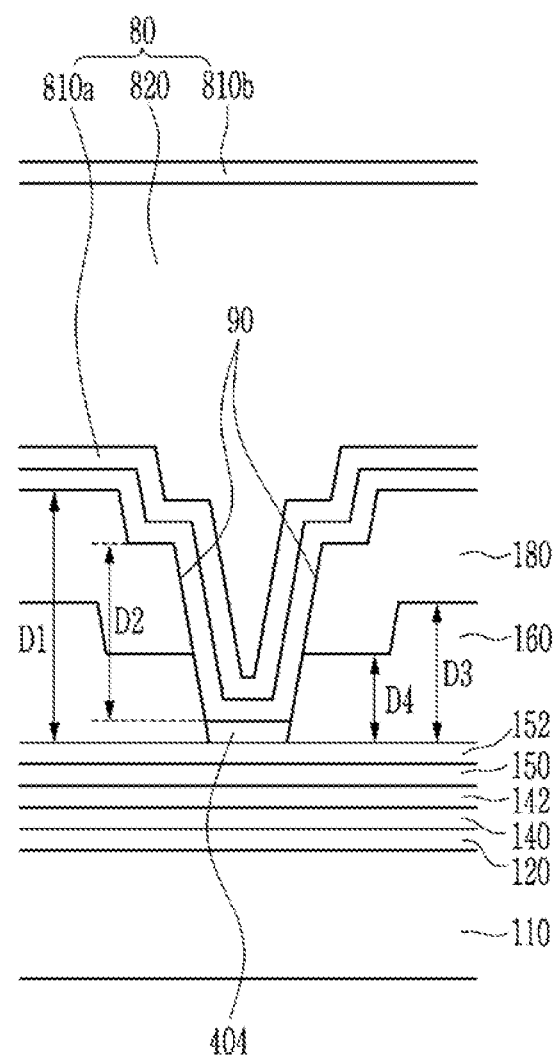
FIG. 20 is a cross-sectional view of a part of a display device according to an exemplary embodiment of the present invention.

A display device according to an exemplary embodiment of the present invention will be described in more detail below with reference to FIG. 20. FIG. 20 is a cross-sectional view of a part of a display device according to an exemplary embodiment of the present invention.

A display device described with reference to FIG. 20, below is similar to the display devices described above (e.g., with reference to FIG. 2 and FIG. 3). Thus, duplicative descriptions of components that are the same or substantially the same as those described above (e.g., with reference to FIG. 2 and FIG. 3) may be omitted below with reference to FIG. 20.

Referring to FIG. 20, a display device according to an exemplary embodiment of the present invention may include the fifth auxiliary pattern 404 disposed in the blocking region VA, and the fourth thickness D4 of the first interlayer insulating layer 160 disposed in the blocking region VA may be smaller than the third thickness D3 of the first interlayer insulating layer 160 disposed in the non-display area NDA except for the display area DA and the blocking region VA. The groove 90 may be formed in the first interlayer insulating layer 160 and the second interlayer insulating layer 180 disposed in the blocking region VA, and the groove 90 may overlap the fifth auxiliary pattern 404 disposed in the blocking region VA (e.g., along the direction orthogonal to the upper surface of the substrate 110).

The fifth auxiliary pattern 404 may be disposed on the second insulating layer 152. The fifth auxiliary pattern 404 may be substantially simultaneously formed with and may include a same layer as the data line 171, the driving voltage line 172, and the output member 173 of the display area DA.

When the groove 90 is formed in the first interlayer insulating layer 160 and the second interlayer insulating layer 180 disposed in the blocking region VA overlapping the thin film encapsulation layer 80, moisture and air may be prevented from flowing into the display area DA side by the thin film encapsulation layer 80 through the first interlayer insulating layer 160 and the second interlayer insulating layer 180 disposed in the non-display area NDA.

The groove 90 may overlap the fifth auxiliary pattern 404 disposed in the blocking region VA and the thickness of the first interlayer insulating layer 160 disposed in the blocking region VA may be lowered, and the second thickness D2 of the groove 90 formed in the blocking region VA may be lower than the first thickness D1 of the first interlayer insulating layer 160 and the second interlayer insulating layer 180 disposed in the display area DA, when forming the groove 90, the organic material may be prevented from remaining, and moisture and air may be prevented from flowing through the organic material remaining in the groove 90. For example, moisture or oxygen might not flow through a space formed below the groove 90. Thus, the groove 90 may prevent a penetration of moisture or oxygen, such as a penetration of moisture or oxygen to an emission layer or a signal line of a display device.

In an exemplary embodiment of the present invention, the thickness of the first interlayer insulating layer 160 may be relatively low in the blocking region VA, however exemplary embodiments of the present invention are not limited thereto, and the thickness of at least one interlayer insulating layer of the first interlayer insulating layer 160 and the second interlayer insulating layer 180 may be lowered in the blocking region VA.

While the present invention has been shown and described with reference to the exemplary embodiments thereof, it will be apparent to those of ordinary skill in the art that various changes in form and detail may be made thereto without departing from the spirit and scope of the present invention

What is claimed is:

1. A display device comprising:
a substrate including a display area and a non-display area adjacent to the display area, wherein the non-display area includes a blocking region;
an organic layer disposed on the substrate, the organic layer including a groove penetrating an entire thickness of the organic layer in the blocking region;
an emission layer disposed in the display area of the substrate;
an auxiliary pattern disposed in the blocking region of the non-display area of the substrate and overlapping the groove;
an insulating layer disposed between the auxiliary pattern and a bottom surface of the groove, any portion of the insulating layer that does not overlap the groove is disposed under the organic layer in the blocking region; and
a thin film encapsulation layer disposed on the substrate and overlapping the emission layer and the blocking region,
wherein
the thin film encapsulation layer includes a first inorganic encapsulation layer and a second inorganic encapsulation layer, and
an organic encapsulation layer disposed between the first inorganic encapsulation layer and the second inorganic encapsulation layer,
the organic encapsulation layer substantially covers the display area and a part of the non-display area, and
the blocking region overlaps the organic encapsulation layer.

2. The display device of claim 1, further comprising a common voltage transmitting line disposed in the non-display area, and
the blocking region is disposed between the display area and the common voltage transmitting line.

3. The display device of claim 2, further comprising a first spacer and a second spacer disposed in the non-display area,
the first spacer overlaps the common voltage transmitting line, and
the second spacer is separated farther from the display area than the first spacer.

4. A display device, comprising:
a substrate including a display area and a non-display area adjacent to the display area, wherein the non-display area includes a blocking region;
an organic layer disposed on the substrate;
an emission layer disposed in the display area of the substrate;
an auxiliary pattern disposed in the blocking region of the non-display area of the substrate;
a thin film encapsulation layer disposed on the substrate and overlapping the emission layer and the blocking region, wherein the thin film encapsulation layer includes:

a first inorganic encapsulation layer and a second inorganic encapsulation layer, and an organic encapsulation layer disposed between the first inorganic encapsulation layer and the second inorganic encapsulation layer, the organic encapsulation layer substantially covering the display area and a part of the non-display area, and the blocking region overlaps the organic encapsulation layer;

a semiconductor layer disposed on the substrate;

a first gate insulating layer disposed on the semiconductor layer;

the gate electrode disposed on the first gate insulating layer;

a second gate insulating layer disposed on the gate electrode;

a storage electrode disposed on the second gate insulating layer;

a first insulating layer disposed on the storage electrode;

an input electrode and an output electrode disposed on the first insulating layer and connected to the semiconductor layer;

a second insulating layer disposed on the input electrode and the output electrode; and a data line and a driving voltage line disposed on the second insulating layer, wherein the organic layer includes a first interlayer insulating layer disposed on the second insulating layer and a second interlayer insulating layer disposed on the first interlayer insulating layer;

wherein the organic layer has a groove penetrating an entire thickness of the organic layer in the blocking region, and the auxiliary pattern overlaps the groove.

5. The display device of claim 4, wherein the auxiliary pattern may include a same material as the gate electrode.

6. The display device of claim 4, wherein the auxiliary pattern includes a first layer and a second layer overlapping each other with the second gate insulating layer disposed between the first layer and the second layer, the first layer includes a same material as the gate electrode, and the second layer includes a same material as the storage electrode.

7. The display device of claim 4, wherein the auxiliary pattern is disposed on the first insulating layer, and the auxiliary pattern comprises a same material as the input electrode and the output electrode.

8. The display device of claim 4, wherein the auxiliary pattern includes a first layer and a second layer overlapping each other with the second insulating layer disposed between the first layer and the second layer, the first layer includes a same material as the input electrode and the output electrode, and the second layer includes a same material as the data line and the driving voltage line.

9. The display device of claim 4, wherein the auxiliary pattern includes a same material as the data line and the driving voltage line.

10. A display device, comprising:

a substrate including a display area and a non-display area adjacent to the display area, wherein the non-display area includes a blocking region;

an insulating layer disposed on the substrate;

an organic layer disposed on the insulating layer in the display area and the non-display area;

a common electrode disposed on the organic layer;

an inorganic encapsulation layer disposed on the common electrode;

an auxiliary pattern disposed between the substrate and the insulating layer; and an organic encapsulation layer disposed on the inorganic encapsulation layer in the display area and the non-display area, wherein the common electrode defines a groove in the organic layer in the blocking region, wherein the insulating layer is disposed between a portion of the common electrode defining a bottom surface of the groove and the auxiliary pattern, wherein the auxiliary pattern overlaps the groove along a direction orthogonal to an upper surface of the substrate, and wherein the organic encapsulation layer fills the groove.

11. The display device of claim 10, wherein the organic layer includes a first interlayer insulating layer and a second interlayer insulating layer disposed on the first interlayer insulating layer.

* * * * *